United States Patent
Seo et al.

(10) Patent No.: US 10,109,683 B2
(45) Date of Patent: *Oct. 23, 2018

(54) LIGHT-EMITTING DEVICE COMPRISING LIGHT-EMITTING ELEMENT THAT IS OPTICALLY OPTIMIZED INDEPENDENTLY

(71) Applicant: Semiconductor Energy Laboratory Co., Ltd., Kanagawa-ken (JP)

(72) Inventors: Satoshi Seo, Kanagawa (JP); Nobuharu Ohsawa, Kanagawa (JP); Toshiki Sasaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 15 days.

This patent is subject to a terminal disclaimer.

(21) Appl. No.: 15/626,491

(22) Filed: Jun. 19, 2017

(65) Prior Publication Data

US 2017/0317149 A1    Nov. 2, 2017

Related U.S. Application Data

(63) Continuation of application No. 14/645,991, filed on Mar. 12, 2015, now Pat. No. 9,691,825.

(30) Foreign Application Priority Data

Mar. 13, 2014  (JP) .................................. 2014-050233
Mar. 13, 2014  (JP) .................................. 2014-050483

(51) Int. Cl.
*H01L 29/08*   (2006.01)
*H01L 27/32*   (2006.01)
*H01L 51/52*   (2006.01)

(52) U.S. Cl.
CPC ...... *H01L 27/3213* (2013.01); *H01L 51/5234* (2013.01); *H01L 51/5265* (2013.01)

(58) Field of Classification Search
CPC .............................. H01L 27/32; H01L 51/52
(Continued)

(56) References Cited

U.S. PATENT DOCUMENTS 7,732,808 B2   6/2010 Ikeda et al.
8,803,136 B2   8/2014 Yamazaki et al.
(Continued)

FOREIGN PATENT DOCUMENTS

JP   2007-053090 A   3/2007
JP   2010-541180     12/2010

*Primary Examiner* — Caleb Henry
(74) *Attorney, Agent, or Firm* — Husch Blackwell LLP

(57) ABSTRACT

Provided is a light-emitting device which can emit monochromatic lights with high color purity due to a microcavity effect and which can provide a white light with a broad spectrum when the monochromatic lights are combined. The light-emitting device has a red-, green-, blue-, and yellow-emissive light-emitting elements each of which has a reflective electrode and a semi-transmissive and semi-reflective electrode. The red-, green-, blue-, and yellow-emissive light-emitting elements have the same structure other than the reflective electrode and a layer in contact with the reflective electrode to selectively emit red, green, blue, and yellow lights, respectively. Red, green, and blue color filters are also provided over the red-, green-, blue-, light-emitting elements, respectively. An EL layer is commonly shared by the red-, green-, blue-, and yellow-emissive light-emitting elements, and the semi-transmissive and semi-reflective electrode covers an edge portion of the EL layer.

20 Claims, 10 Drawing Sheets

(58) Field of Classification Search
USPC .......................................................... 257/40
See application file for complete search history.

(56) References Cited

U.S. PATENT DOCUMENTS

| | | |
|---|---|---|
| 2005/0231946 A1 | 10/2005 | Guthrie |
| 2006/0082295 A1 | 4/2006 | Chin et al. |
| 2007/0035243 A1 | 2/2007 | Lee |
| 2007/0058182 A1 | 3/2007 | Huibers |
| 2009/0091238 A1 | 4/2009 | Cok et al. |
| 2010/0231484 A1 | 9/2010 | Cok et al. |
| 2013/0082589 A1 | 4/2013 | So et al. |
| 2013/0112955 A1 | 5/2013 | Yamazaki et al. |
| 2013/0264549 A1 | 10/2013 | Yamazaki et al. |
| 2013/0265320 A1 | 10/2013 | Yamazaki et al. |
| 2014/0117339 A1 | 5/2014 | Seo |
| 2014/0134771 A1 | 5/2014 | Noda et al. |
| 2014/0203244 A1 | 7/2014 | Hack et al. |
| 2014/0225102 A1 | 8/2014 | Ikeda et al. |
| 2014/0284575 A1 | 9/2014 | Sugisawa et al. |
| 2014/0284576 A1 | 9/2014 | Sugisawa et al. |
| 2014/0291648 A1 | 10/2014 | Yamazaki et al. |
| 2014/0306201 A1 | 10/2014 | Yamazaki et al. |
| 2014/0332831 A1 | 11/2014 | Ohsawa et al. |
| 2014/0339526 A1 | 11/2014 | Inoue et al. |
| 2015/0255520 A1 | 9/2015 | Seo et al. |
| 2015/0340410 A1 | 11/2015 | Hack et al. |

LIGHT-EMITTING DEVICE COMPRISING LIGHT-EMITTING ELEMENT THAT IS OPTICALLY OPTIMIZED INDEPENDENTLY

BACKGROUND OF THE INVENTION

This application is a continuation of copending U.S. application Ser. No. 14/645,991, filed on Mar. 12, 2015 which is incorporated herein by reference.

1. Field of the Invention

One embodiment of the present invention relates to a light-emitting element in which an organic compound capable of providing light emission by application of an electric field is provided between a pair of electrodes, and also relates to a light-emitting device, an electronic device, and a lighting device including such a light-emitting element.

Note that one embodiment of the present invention is not limited to the above technical field. Specifically, examples of the technical field of one embodiment of the present invention disclosed in this specification include a semiconductor device, a display device, a liquid crystal display device, a light-emitting device, a lighting device, a method for driving any of them, and a method for manufacturing any of them.

2. Description of the Related Art

As next generation lighting devices or display devices, display devices using light-emitting elements (organic EL elements) in which organic compounds are used as light-emitting substances have been developed and partially commercialized because of their potential for thinness, lightness, high speed response to input signals, low power consumption, and the like.

In a light-emitting element, voltage application between electrodes between which a light-emitting layer is provided causes recombination of electrons and holes injected from the electrodes, which leads a light-emitting substance that is an organic compound to an excited state, and the return from the excited state to the ground state is accompanied by light emission. Since the spectrum of light emitted from a light-emitting substance is peculiar to the light-emitting substance, use of different types of organic compounds for light-emitting substances makes it possible to provide light-emitting elements which exhibit various colors.

In the case of light-emitting devices which are expected to display images, such as displays, at least three-color light, i.e., red light, green light, and blue light, is necessary for reproduction of full-color images. Further, to enhance image quality with favorable color reproducibility, various efforts such as use of a microcavity structure and a color filter (coloring layer) have been made to improve color purity.

A light-emitting device with lower power consumption due to addition of white light to three-color light (red light, green light, and blue light) has been proposed and commercialized.

There are mainly three methods to realize full-color display using the light-emitting elements described above: so-called side-by-side patterning in which light-emitting elements which emit light of different colors are separately formed; a white-color filter method in which a white-emissive light-emitting element is combined with a color filter; and a color conversion method in which a monochromatic light-emitting element such as a blue-emissive light-emitting element is combined with a color conversion filter. Each of the methods has advantages and disadvantages.

PATENT DOCUMENT

[Patent Document 1] Japanese Published Patent Application No. 2007-53090

SUMMARY OF THE INVENTION

Compared to the side-by-side patterning, high definition can be easily achieved by the white-color filter method because a plurality of light-emitting elements giving different emission colors (e.g., red, green, and blue) shares one light-emitting layer. Further, higher definition can be achieved by adoption of a top emission structure with which a high aperture ratio can be easily achieved compared to the case of a bottom emission structure. Thus, it can be said that a combination of the white-color filter method and a top emission structure (hereinafter referred to as a white-color filter top emission structure) is a suitable display method for display market where high definition is still demanded.

In the light-emitting device with such a white-color filter top emission structure, when a white-emissive light-emitting element is added to red-, green-, and blue-emissive light-emitting elements, power consumption can also be reduced. However, viewing angle dependence of chromaticity of the white-emissive light-emitting element is large compared with the red-, green-, and blue-emissive light-emitting elements.

In the top emission structure, an upper electrode is formed by using a light-transmitting member because light is extracted from the upper electrode side of the light-emitting element. However, a transparent conductive film typified by ITO has high resistance among conductive materials used as an electrode material; thus, the upper electrode is generally formed using a combination of the transparent conductive film and a metal thin film with low resistance.

The metal thin film is formed to be thin enough to have a light-transmitting property; however, the metal thin film reflects light. Thus, the upper electrode serves as a semi-transmissive and semi-reflective electrode. Accordingly, in the light-emitting element having such a structure, a microcavity structure is necessarily formed with a reflective electrode that is a lower electrode and a semi-transmissive and semi-reflective electrode that is an upper electrode.

The optical path lengths between the upper electrode and the lower electrode are independently adjusted in the red-, green-, and blue-emissive light-emitting elements so that emission of the corresponding color is amplified; therefore, both front luminance and color purity can be improved. However, in the white-emissive light-emitting element, it is difficult to obtain white light emission if a specific emission is amplified.

As mentioned above, the viewing angle dependence of chromaticity of the white-emissive light-emitting element is larger than those of the red-, green-, and blue-emissive light-emitting elements. In the case of the red-, green-, and blue-emissive light-emitting elements, the viewing angle dependence of chromaticity can be suppressed by using a color filter. In contrast, in the case of white-emissive light emitting element, a large color shift occurs when an image is viewed from an oblique direction because no color filter is employed.

One embodiment of the present invention is to provide a light-emitting device which can emit monochromatic lights with high purity due to a microcavity effect and which can provide a broad spectral range of white light when the monochromatic lights are combined. Another embodiment of the present invention is to provide a light-emitting device which emits white light with low power consumption. Another embodiment of the present invention is to provide a light-emitting device with low viewing-angle dependence of chromaticity and luminance. Another embodiment of the present invention is to provide a high-definition light-emitting device. Another embodiment of the present invention is to provide a high-definition electronic device and a lighting device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device which includes a plurality of light-emitting elements including an EL layer used in common between a reflective electrode that is formed in each light-emitting element and a semi-transmissive and semi-reflective electrode that is common to each of the light-emitting elements, in which a microcavity structure and a color filter are used in combination. The EL layer includes a first light-emitting substance, a second light-emitting substance, and a third light-emitting substance. The lights obtained from the plurality of light-emitting elements are monochromatic and different in color from one another. The semi-transmissive and semi-reflective electrode covers an edge portion of the EL layer.

One embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. A fourth color filter is over the semi-transmissive and semi-reflective electrode of the fourth light-emitting element. The EL layer includes a first light-emitting substance, a second light-emitting substance, and a third light-emitting substance. The first light-emitting element emits first monochromatic light through a first color filter. The second light-emitting element emits second monochromatic light through a second color filter. The third light-emitting element emits third monochromatic light through a third color filter. The fourth light-emitting element emits light corresponding to a complementary color of the first monochromatic light through the fourth color filter. An optical path length between the fourth reflective electrode and the semi-transmissive and semi-reflective electrode is set so as to intensify light corresponding to the complementary color of the first monochromatic light. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. A fourth color filter is over the semi-transmissive and semi-reflective electrode of the fourth light-emitting element. The EL layer includes a first light-emitting substance, a second light-emitting substance, and a third light-emitting substance. The first light-emitting element emits first monochromatic light through the first color filter. The second light-emitting element emits second monochromatic light through the second color filter. The third light-emitting element emits third monochromatic light through the third color filter. The fourth light-emitting element emits light having an emission spectrum peak in a wavelength range from 540 nm to 580 nm both inclusive through the fourth color filter. An optical path length between the fourth reflective electrode and the semi-transmissive and semi-reflective electrode is set so as to intensify light having an emission spectrum peak in a wavelength range from 540 nm to 580 nm both inclusive. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. A fourth color filter is over the semi-transmissive and semi-reflective electrode of the fourth light-emitting element. The EL layer includes a first light-emitting substance, a second light-emitting substance, and a third light-emitting substance. The first light-emitting element emits first monochromatic light through the first color filter. The second light-emitting element emits second monochromatic light through the second color filter. The third light-emitting element emits third monochromatic light through the third color filter. The fourth light-emitting element emits yellow light through the fourth color filter. An optical path length between the fourth reflective electrode and the semi-transmissive and semi-reflective electrode is set so as to intensify yellow light. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. The EL layer includes a first light-emitting substance emitting first light, a second light-emitting substance emitting second light, and a third light-emitting substance emitting third light. An optical path length between the fourth reflective electrode and the semi-transmissive and semi-reflective electrode is set so as to intensify yellow light. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the. EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. The EL layer includes a first light-emitting substance emitting red light, a second light-emitting substance emitting green light, and a third light-emitting substance emitting blue light. An optical path length between the fourth reflective electrode and the semi-transmissive and semi-reflective electrode is set so as to intensify yellow light. The semi-transmissive and semi-reflective electrode is formed so as to cover an edge portion of the EL layer.

Another embodiment of the present invention is a light-emitting device which includes a first light-emitting element, a second light-emitting element, a third light-emitting element, and a fourth light-emitting element. The first light-emitting element includes a first reflective electrode, an EL layer, and a semi-transmissive and semi-reflective electrode. The second light-emitting element includes a second reflective electrode, the EL layer, and the semi-transmissive and semi-reflective electrode. The third light-emitting element includes a third reflective electrode, the EL layer, and the semi-transmissive and semi-reflective electrode. The fourth light-emitting element includes a fourth reflective electrode, the EL layer, and the semi-transmissive and semi-reflective electrode. Between the first reflective electrode and the EL layer, a first transparent conductive film is in contact with the first reflective electrode. Between the second reflective electrode and the EL layer, a second transparent conductive film is in contact with the second reflective electrode. Between the third reflective electrode and the EL layer, a third transparent conductive film is in contact with the third reflective electrode. Between the fourth reflective electrode and the EL layer, a fourth transparent conductive film is in contact with the fourth reflective electrode. A first color filter is over the semi-transmissive and semi-reflective electrode of the first light-emitting element. A second color filter is over the semi-transmissive and semi-reflective electrode of the second light-emitting element. A third color filter is over the semi-transmissive and semi-reflective electrode of the third light-emitting element. The EL layer includes a first light-emitting substance emitting red light, a second light-emitting substance emitting green light, and a third light-emitting substance emitting blue light. An optical path length between the fourth reflective electrode and the semi-transmissive and semi-reflective electrode is set so as to intensify light having an emission spectrum peak in a wavelength range from 540 nm to 580 nm both inclusive. The semi-transmissive and semi-reflective electrode is formed so as to cover an edge portion of the EL layer.

Another embodiment of the present invention is a light-emitting device in each of the above structures, in which the first light-emitting element emits red light, the second light-emitting element emits green light, and the third light-emitting element emits blue light.

Another embodiment of the present invention is a light-emitting device in each of the above structures, in which the first light-emitting substance has an emission spectrum peak in a wavelength range from 570 nm to 680 nm both inclusive.

Another embodiment of the present invention is a light-emitting device in each of the above structures, in which the second light-emitting substance has an emission spectrum peak in a wavelength range from 490 nm to 580 nm both inclusive.

Another embodiment of the present invention is a light-emitting device in each of the above structures, in which the third light-emitting substance has an emission spectrum peak in a wavelength range from 400 nm to 490 nm both inclusive.

Another embodiment of the present invention is a light-emitting device in each of the above structures, in which the optical path length between the first reflective electrode and the semi-transmissive and semi-reflective electrode is set so as to relatively intensify red light, the optical path length between the second reflective electrode and the semi-transmissive and semi-reflective electrode is set so as to relatively intensify green light, and the optical path length between the third reflective electrode and the semi-transmissive and semi-reflective electrode is set so as to relatively intensify blue light.

Another embodiment of the present invention is a light-emitting device in each of the above structures, in which the EL layer has a tandem structure including a first EL layer, an intermediate layer, and a second EL layer; the first EL layer includes a first light-emitting layer containing a first light-emitting substance and a second light-emitting layer containing a second light-emitting substance which are in contact with each other; the second EL layer includes a third light-emitting layer containing a third light-emitting substance; and an optical path length from the interface between the first light-emitting layer and the second light-emitting layer to the semi-transmissive and semi-reflective electrode is $\lambda_{RYG}/4$ ($\lambda_{RYG}$ is greater than or equal to 500 nm and less than or equal to 600 nm).

Another embodiment of the present invention is an electronic device including the light-emitting device having any of the above structures.

Another embodiment of the present invention is a lighting device including the light-emitting device having any of the above structures.

One embodiment of the present invention also includes, in its scope, an electronic device and a lighting device each including the light-emitting device described in any of the above structures. The light-emitting device in this specification refers to an image display device and a light source (e.g., a lighting device). In addition, the light-emitting device might include any of the following modules in its category: a module in which a connector such as a flexible printed circuit (FPC) or a tape carrier package (TCP) is attached to a light-emitting device; a module having a TCP provided with a printed wiring board at the end thereof; and a module having an integrated circuit (IC) directly mounted on a light-emitting element by a chip on glass (COG) method.

According to one embodiment of the present invention, a light-emitting device which can emit monochromatic lights with high purity due to a microcavity effect and which can emit white light when the monochromatic lights are combined. Further, a light-emitting device which emits white light with low power consumption is provided. Furthermore, a light-emitting device with low viewing-angle dependence of chromaticity and luminance is provided. Further, a high-definition light-emitting device is provided. Furthermore, a high-definition electronic device and a lighting device are provided. Moreover, an electronic device and a lighting device with low power consumption are provided. Note that the description of these effects does not disturb the existence of other effects. One embodiment of the present invention does not necessarily achieve all the objects listed above. Other effects will be apparent from and can be derived from the description of the specification, the drawings, the claims, and the like.

DETAILED DESCRIPTION OF THE INVENTION

Embodiments of the present invention will be explained below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

(Embodiment 1)

In this embodiment, a light-emitting element included in a light-emitting device that is one embodiment of the present invention is described.

The light-emitting element described in this embodiment has a structure in which an EL layer including a light-emitting layer is provided between a pair of electrodes. Note that a single EL layer may be included in the light-emitting element; alternatively, EL layers may be stacked with a charge generation layer provided therebetween (tandem structure). In this embodiment, a light-emitting element which has a tandem structure with two EL layers stacked is described with reference to FIG. 1.

Figure 1:
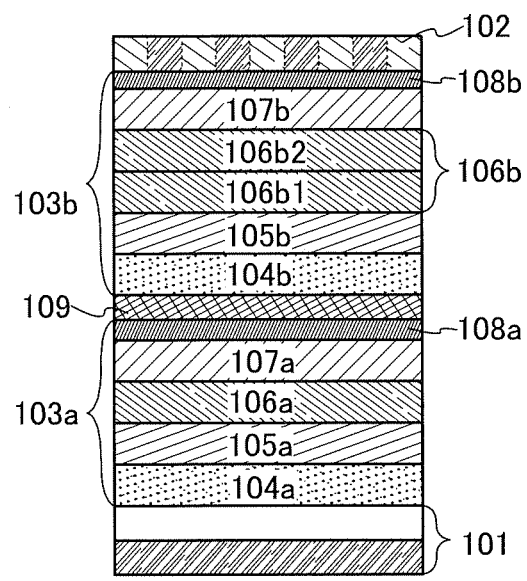
FIG. 1 illustrates a structure of a light-emitting element.

The light-emitting element illustrated in FIG. 1 has a structure in which two EL layers (103a and 103b) each including a light-emitting layer are provided between a pair of electrodes (a first electrode 101 and a second electrode 102). In the EL layer 103a, a hole-injection layer 104a, a hole-transport layer 105a, a light-emitting layer 106a, an electron-transport layer 107a, an electron-injection layer 108a, and the like are sequentially stacked from the first electrode 101 (anode) side. In the EL layer 103b, a hole-injection layer 104b, a hole-transport layer 105b, light-emitting layers 106b1 and 106b2, an electron-transport layer 107b, an electron-injection layer 108b, and the like are sequentially stacked from the first electrode 101 (anode) side. An electron relay layer 109 is provided between the EL layer 103a and the EL layer 103b. Note that, although not shown, the electron relay layer 109 may be omitted so that the electron-injection layer 108a and the hole-injection layer 104b are in contact with each other. Here, the whole or a part of the region from the electron-injection layer 108a to the hole-injection layer 104b functions as the charge generation layer. The charge generation layer is also referred to as an intermediate layer. One of the first electrode 101 and the second electrode 102 is a reflective electrode, and the other is a semi-transmissive and semi-reflective electrode. Hereinafter, explanation is given to the case where the former is a reflective electrode and the latter is a semi-transmissive and semi-reflective electrode.

The EL layers included in the light-emitting element used in the light-emitting device of one embodiment of the present invention include a first light-emitting substance, a second light-emitting substance, and a third light-emitting substance which have different emission colors. In the case of the light-emitting device with a tandem structure shown in FIG. 1, each of the light-emitting layers 106a, 106b1, and 106b2 includes the first light-emitting substance, the second light-emitting substance, and the third light-emitting substance, respectively, and may further include other substance in combination of these substances. Light emitted from the first to the third light-emitting substances may be either fluorescence or phosphorescence. In the case of a light-emitting element including a single EL layer, a light-emitting layer including the first light-emitting substance, a light-emitting layer including the second light-emitting substance, and a light-emitting layer including the third light-emitting substance may be stacked.

The charge generation layer has a function of injecting electrons into one of the EL layers (103a or 103b) and injecting holes into the other of the EL layers (103b or 103a) when a voltage is applied between the first electrode 101 and the second electrode 102. Thus, in FIG. 1, when a voltage is applied such that the potential of the first electrode 101 is higher than that of the second electrode 102, the charge-generation layer injects electrons into the EL layer 103a and injects holes into the EL layer 103b.

In terms of light extraction efficiency, the charge-generation layer preferably has a light-transmitting property with respect to visible light (specifically, the charge-generation layer has a visible light transmittance of 40% or more). The charge generation layer functions even if it has lower conductivity than the first electrode 101 or the second electrode 102.

In the light-emitting element illustrated in FIG. 1, light emitted from the light-emitting layers 106a, 106b1, and 106b2 included in the EL layers (103a and 103b) is resonated by the first electrode (reflective electrode) 101 and the second electrode (semi-transmissive and semi-reflective electrode) 102 which function as a micro optical resonator (microcavity). Light is emitted through the second electrode 102. The first electrode 101 has a layer including a reflective conductive film and a transparent conductive film stacked over the reflective conductive film. Optical adjustment is performed by controlling the thickness of the transparent conductive film. The optical adjustment may be performed by controlling the thickness of the hole-injection layer 104a included in the first EL layer 103a.

As described above, the optical adjustment is performed by controlling the thicknesses of the first electrode 101 or the hole-injection layer 104a, whereby a spectrum arbitrarily selected from the spectra of the light-emitting layers 106a, 106b1, and 106b2 can be selectively amplified and narrowed. Hence, although the light-emitting layers 106a, 106b1, and 106b2 give a broad spectrum as a whole, light emission with high color purity can be obtained from the light-emitting element.

Note that due to the microcavity effect formed with the first electrode 101 and the second electrode 102, the light-emitting layers 106a, 106b1, and 106b2 each emit blue light (e.g., with an emission spectrum peak in a wavelength range from 400 nm to 480 nm both inclusive, preferably in a wavelength range from 450 nm to 470 nm both inclusive), green light (e.g., with an emission spectrum peak in a wavelength range from 500 nm to 560 nm both inclusive, preferably in a wavelength range from 520 nm to 555 nm both inclusive), red light (e.g., with an emission spectrum peak in a wavelength range from 580 nm to 680 nm both inclusive, preferably in a wavelength range from 600 nm to 620 nm both inclusive), or yellow light (also including yellow-green and orange light) (e.g., with an emission spectrum peak in a wavelength range from 540 nm to 600 m both inclusive, preferably in a wavelength range from 540 nm to 580 nm both inclusive).

As the light-emitting substances which can be used for the light-emitting layers (106a, 106b1, and 106b2), red-, green-, or a blue-emissive substances can be used. Specific combinations of emission colors of the light-emitting substances used for the light-emitting layers 106a, 106b1, and 106b2 (106a, 106b1, 106b2) are given below. "Blue, green, red", "blue, red, green", "blue, yellow, green", "blue, green, yellow", "blue, yellow, red", "green, blue, red", "green, red, blue", "green, yellow, red", "green, blue, yellow", "green, yellow, blue", "red, green, blue", "red, blue, green", "red yellow, blue", "red, blue, yellow", and "red, yellow, green". In the specification, red-, green-, and blue-emissive substance means the substances which respectively exhibit emission peaks in wavelength ranges from 570 nm to 680 nm both inclusive, from 490 nm to 580 nm both inclusive, and from 400 nm to 490 nm both inclusive.

The above-described light-emitting element is combined with a color filter corresponding to an emission color extracted utilizing a microcavity effect, so that an emission spectrum from the light-emitting element can be further narrowed.

Next, a specific example in manufacturing the above light-emitting element is described.

The first electrode 101 is a reflective electrode and thus is formed of a conductive material having reflectivity, and a film whose visible light reflectivity is greater than or equal to 40% and less than or equal to 100%, preferably greater than or equal to 70% and less than or equal to 100%, and resistivity is $1\times10^{-2}$ Ωcm or lower is used. The second electrode 102 is formed using a conductive material having reflectivity and a conductive material having a light-transmitting property, and a film whose visible light reflectivity is greater than or equal to 20% and less than or equal to 80%, preferably greater than or equal to 40% and less than or equal to 70%, and whose resistivity is $1\times10^{-2}$ Ωcm or lower is used.

The optical path length between the first electrode 101 and the second electrode 102 is adjusted so that desired light is resonated and amplified. Specifically, the thickness of the transparent conductive film included in the first electrode 101 is changed so that the optical path length between the electrodes can be m λ/2 (m is a natural number) where λ is the wavelength of the desired light.

Further, the optical path length between the first electrode 101 and a light-emitting layer emitting desired light is adjusted in order to amplify the desired light. To be more specific, the thickness of the transparent conductive film included in the first electrode 101 or the thickness of an organic film for forming the hole-injection layer 104a is changed so that the optical path length is (2m'+1) λ/4 (m' is a natural number)

The optical path length between the first electrode 101 and the second electrode 102 is a product of a thickness and a refractive index of a region from a reflective region in the first electrode 101 to a reflective region in the second electrode 102. The optical path length between the first electrode 101 and the light-emitting layer emitting the desired light is a product of a thickness and a refractive index of a region from the reflective region in the first electrode 101 to an emission region in the light-emitting layer emitting the desired light. In the specification, the positions arbitrarily selected from the first electrode 101, the second electrode 102, and the emission region can be used as the reflective region and the emission region, respectively, to determine the optical path lengths.

Any of metals, alloys, electrically conductive compounds, mixtures thereof, and the like can be used as appropriate for materials for forming the first electrode 101 and the second electrode 102 which satisfy the above conditions. Specifically, indium oxide-tin oxide (indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The first electrode 101 and the second electrode 102 can be formed by, for example, a sputtering method or an evaporation method (including a vacuum evaporation method).

The hole-injection layers 104a and 104b inject holes into the light-emitting layers (106a, 106b1, and 106b2) through the hole-transport layers (105a and 105b) with high hole-transport properties. The hole-injection layers (104a and 104b) may contain a hole-transport material and an acceptor substance, so that electrons are abstracted from the hole-transport material by the acceptor substance to generate holes and the holes are injected into the light-emitting layers (106a, 106b1, and 106b2) through the hole-transport layers (105a and 105b). The hole-transport layers (105a and 105b) are formed using hole-transport materials.

Specific examples of the hole-transport materials used for the hole-injection layers 104a and 104b and the hole-transport layers 105a and 105b include aromatic amine compounds such as 4,4'-bis[N-(1-naphthyl)-N-phenylamino]biphenyl (abbreviation: NPB or a-NPD), N,N'-bis (3-methylphenyl)-N,N'-diphenyl-[1,1'biphenyl]-4,4'-diamine (abbreviation: TPD), 4,4',4"-tris(carbazol-9-yl) triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Alternatively, the following carbazole derivative can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl) phenyl]-9H-Carbazole (abbreviation: CzPA). These materials described here mainly are substances having a hole mobility of greater than or equal to $10^{-6}$ cm$^2$(V.s). However, besides the above materials, others may be used as long as the material has a higher hole transport property than an electron transport property.

Still other examples include high molecular compounds such as poly(N-vinylcarbazole) (abbreviation: PVK), poly (4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

Examples of the acceptor substance used for the hole-injection layers 105a and 105b include oxides of metals belonging to Groups 4 to 8 of the periodic table. Specifically, it is preferable to use vanadium oxide, niobium oxide, tantalum oxide, chromium oxide, molybdenum oxide, tungsten oxide, manganese oxide, and rhenium oxide because of their high electron accepting properties. In particular, molybdenum oxide is more preferable because of its stability in the atmosphere, low hygroscopic property, and easiness of handling. Other than the oxides of the metals, 7,7,8,8-tetracyano-2,3,5,6-tetrafluoroquinodimethane (abbreviation: $F_4$-TCNQ), chloranil, and the like can be also used as the acceptor substance.

The light-emitting layers (106a, 106b1, and 106b2) contain light-emitting substances. Note that the light-emitting layers (106a, 106b1, and 106b2) each contain one or both of an electron-transport material and a hole-transport material in addition to the light-emitting substance.

Light-emitting substances that convert singlet excitation energy into luminescence or light-emitting substances that converts triplet excitation energy into luminescence can be used for the light-emitting substances which can be used for the light-emitting layers (106a, 106b1, and 106b2). Described below are examples of the light-emitting substances.

As an example of the light-emitting substance converting singlet excitation energy into luminescence, a substance emitting fluorescence can be given. Specific examples of the substance emitting fluorescence include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-pheny lenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), {2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), {2-tert-butyl-6-[2-(1,1,7,7-tetramethyl-2,3,6,7-tetrahydro-1H,5H-benzo[ij]quinolizin-9-yl)ethenyl]-4H-pyran-4-ylidene propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM. Condensed aromatic diamine compounds typified by pyrenediamine compounds such as N,N'-bis[4-(9-phenyl-9H-fluoren-9-yl)phenyl]-N,N'-diphenylpyrene-1,6-diamine (abbreviation: 1,6FLPAPrn) and N,N'-bis(3-methylphenyl)-N,N'-bis[3-(9-phenyl-9H-fluoren-9-yl)phenyl]pyrene-1,6-diamine (abbreviation: 1,66mMemFLPAPrn) are preferable because of their high hole-trapping properties and ability to give a light-emitting element with high emission efficiency and high reliability As an example of the light-emitting substance converting triplet excitation energy into luminescence, a substance emitting phosphorescence can be given. Specific examples of the substance which emits blue phosphorescence include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), and tris[3-(5-biphenyl)-5-isopropyl-4-phenyl-4H-1,2,4-triazolato]iridium (III) (abbreviation: Ir(iPr5btz)$_3$); organometallic iridium complexes having 1H-triazole skeletons, such as tris[3-methyl-1-(2-methylphenyl)-5-phenyl-1H-1,2,4-triazolato]iridium(III) (abbreviation: Ir(Mptz1-mp)$_3$) and tris(1-methyl-5-phenyl-3-propyl-1H-1,2,4-triazolato)iridium(III) (abbreviation: Ir(Prptz1-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)).

Specific examples of the substance which emits green phosphorescence include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), bis[2-(6-tent-butyl-4-pyrimidinyl-κN3)phenyl-κC](2,4-pentanedionato-k$^2$O,O')iridium(III) (abbreviation: Ir(tBuppm)$_2$(acac)), (acetylacetonato)bis[4-(2-norbornyl)-6-phenylpyrimidinato]iridium(III) (endo- and exo-mixture) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), (acetylacetonato)bis(4,6-diphenylpyrimidinato)iridium(III) (abbreviation: Ir(dppm)$_2$(acac)), and (acetylacetonato)bis{4,6-dimethyl-2-[6-(2,6-dimethylphenyl)-4-pyrimidinyl-kN3]phenyl-kC}iridium(III) (abbreviation: Ir(dmppm-dmp)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$) iridium (III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium (III) (abbreviation: Ir(bzq)$_3$), tris(2-phenylquinolinato-N,C$^{2'}$)iridium(III) (abbreviation: Ir(pq)$_3$), bis(2-phenylquinolinato-N,C$^{2'}$)iridium(III) acetylacetonate (abbreviation: Ir(pq)$_2$(acac)), and bis{2-[4'-(perfluorophenyl)phenyl]pyridinato-N,C$^{2'}$}iridium(III) acetylacetonate (abbreviation: Ir(p-PF-ph)$_2$(acac)); organoiridium complexes having oxadiazole skeletons such as bis(2,4-diphenyl-1,3-oxazolato-N,C$^{2'}$)iridium(III)acetylacetonate (abbreviation: Ir(dpo)$_2$(acac)); organoiridium complexes having thiadiazole skeletons, such as bis(2-phenylbenzothiazolato-N,C$^{2'}$)iridium(III)acetylacetonate (abbreviation: Ir(bt)$_2$(acac)); and rare earth metal complexes such as tris(acetylacetonato) (monophenanthroline)terbium(III) (abbreviation: Tb(acac)$_3$(Phen)). Note that organometallic iridium complexes having pyrimidine skeletons are especially preferable due to their ability to give light-emitting elements which have distinctively high reliability and emission efficiency.

Specific examples of the substance which emits red phosphorescence include organometallic iridium complexes having pyrimidine skeletons, such as (diisobutyrylmethanato)bis[4,6-bis(3-methylphenyl)pyrimidinato] iridium (III) (abbreviation: Ir(5mdppm)$_2$(dibm)), bis[4,6-bis(3-methylphenyl)pyrimidinato] (dipivaloylmethanato)iridium (III) (abbreviation: Ir(5mdppm)$_2$(dpm)), and bis[4,6-di(naphthalen-1-yl)pyrimidinato] (dipivaloylmethanato)iridium(III) (abbreviation: Ir(d1npm)$_2$(dpm)); organometallic iridium complexes having pyrazine skeletons, such as (acetylacetonato)bis(2,3,5-triphenylpyrazinato)iridium(III) (abbreviation: Ir(tppr)$_2$(acac)), bis(2,3,5-triphenylpyrazinato) (dipivaloylmethanato)iridium(III) (abbreviation: Ir(tppr)$_2$(dpm)), and (acetylacetonato)bis[2,3-bis(4-fluorophenyl)quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N,C$^{2'}$)iridium(III)acetylacetonate (abbreviation: Ir(piq)$_2$(acac)); platinum complexes such as 2,3,7,8,12,13,17,18-octaethyl-21H,23H-porphyrin platinum(II) (abbreviation: PtOEP); and rare earth metal complexes such as, tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato] (monolphenanthroline)europium(III) (abbreviation: Eu(TTA)$_3$(Phen)). Further, an organometallic iridium complex having a pyrazine skeleton can provide red light emission with favorable chromaticity.

The light-emitting layers 106a, 106b1, and 106b2 may include a compound other than the above-described light-emitting substances. The compound play an auxiliary role for adjusting transport properties and carrier trapping properties of the light-emitting layers 106a, 106b1, and 106b2, and serves as a host material. The compound may be either an electron transport material or a hole transport material. For example, an organic compound containing a π-electron deficient heteroaromatic compound such as a nitrogen-containing heteroaromatic compound can be used. Examples of which include electron transport materials such as quinoxaline derivatives and dibenzoquinoxaline derivatives, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3'-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II). Alternatively, π-electron-rich heteroaromatic compound (e.g., a carbazole derivative or an indole derivative) or an aromatic amine compound can be used, examples of which include hole transport materials such as 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), PCzPCN1, 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenyl-benzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(9-phenylcarbazol-3-yl)-N-phenylamino] spiro-9,9'-bifluorene (abbreviation: PCASF), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), TPD, 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), PCz-PCA1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), N,N'-bis{4-[bis(3-methylphenyl)amino]phenyl}-N,N'-diphenyl-(1,1'-biphenyl)-4,4'-diamine (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2). In addition to the these examples, anthracene compounds such as 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), CzPA, 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA) can be given.

The electron-transport layers 107a and 107b are layers containing substances with high electron-transport properties. For the electron-transport layers 107a and 107b, metal complexes such as tris(8-quinolinolato)aluminum (abbreviation: Alq$_3$), tris(4-methyl-8-quinolinolato)aluminum (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum (abbreviation: BAlq, Zn(BOX)$_2$, and bis[2-(2-hydroxyphenyl)benzothiazolato]zinc(II) (abbreviation: Zn(BTZ)$_2$) can be used. In addition, heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation : BzOs) can also be used. Further alternatively, high molecular compounds such as poly(2,5-pyridinediyl) (abbreviation: PPy), poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy) can also be used. The materials mentioned here are mainly substances each having an electron mobility of $1\times10^{-6}$ cm$^2$Vs or higher. However, substances other than the above-described substances may also be used for the electron-transport layers 107a and 107b as long as the electron-transport property is higher than the hole-transport property.

Each of the electron-transport layers 107a and 107b is not limited to a single layer but may be a stack including two or more layers containing any of the above substances.

The electron-injection layers 108a and 108b are layers containing substances with high electron-injection properties. For each of the electron-injection layers 108a and 108b, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. An electride may also be used for the electron-injection layer 108. Examples of the electride include a substance in which electrons are added at high concentration to calcium oxide-aluminum oxide. Any of the substances for forming the electron-transport layers 107a and 107b, which are given above, can be used.

The electron-injection layers 108a and 108b each may be formed using a composite material in which an organic compound and an electron donor are mixed. The composite material is superior in an electron-injection property and an electron-transport property, since electrons are generated in the organic compound by the electron donor. The organic compound here is preferably a material excellent in transporting the generated electrons; specific examples include substances for forming the electron-transport layers 107a and 107b (e.g., metal complexes or heteroaromatic compounds), which are described above. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Further, an oxide and a carbonate of these metals are preferable, and for example, lithium oxide, calcium oxide, barium oxide, cesium carbonate, and the like can be given. Alternatively, Lewis base such as magnesium oxide can also be used. An organic compound such as tetrathiafulvalene (abbreviation: TTF) can also be used.

A phthalocyanine-based material, a metal complex having a metal-oxygen bond and an aromatic ligand can be used in the electron relay layer 109.

The hole-injection layers 104a and 104b, the hole-transport layers 105a and 105b, the light-emitting layers 106a, 106b1, and 106b2, the electron-transport layers 107a and 107b, the electron-injection layers 108a and 108b, and the electron relay layer 109 can be formed by any of the following method: an evaporation method (including a vacuum evaporation method), a printing method (such as relief printing, intaglio printing, gravure printing, planography printing, and stencil printing), an ink jet method, a coating method, and the like.

Although the light-emitting element having two EL layers is described in this embodiment, a light-emitting element in which three or more EL layers are stacked can also be used. Using such a tandem light-emitting element allows high-luminance emission at a low current.

The light-emitting element described in this embodiment has a microcavity structure, in which light (monochromatic light rays) with different wavelengths can be extracted even if the same EL layer is employed.

Note that the structure described in this embodiment can be combined as appropriate with any of the structures described in the other embodiments.

(Embodiment 2)

In this embodiment, one embodiment of a light-emitting device in which the light-emitting element described in Embodiment 1 is combined with a color filter or the like is described. In this embodiment, a structure of a pixel portion of the light-emitting device is described with reference to FIG. 2.

Figure 2:
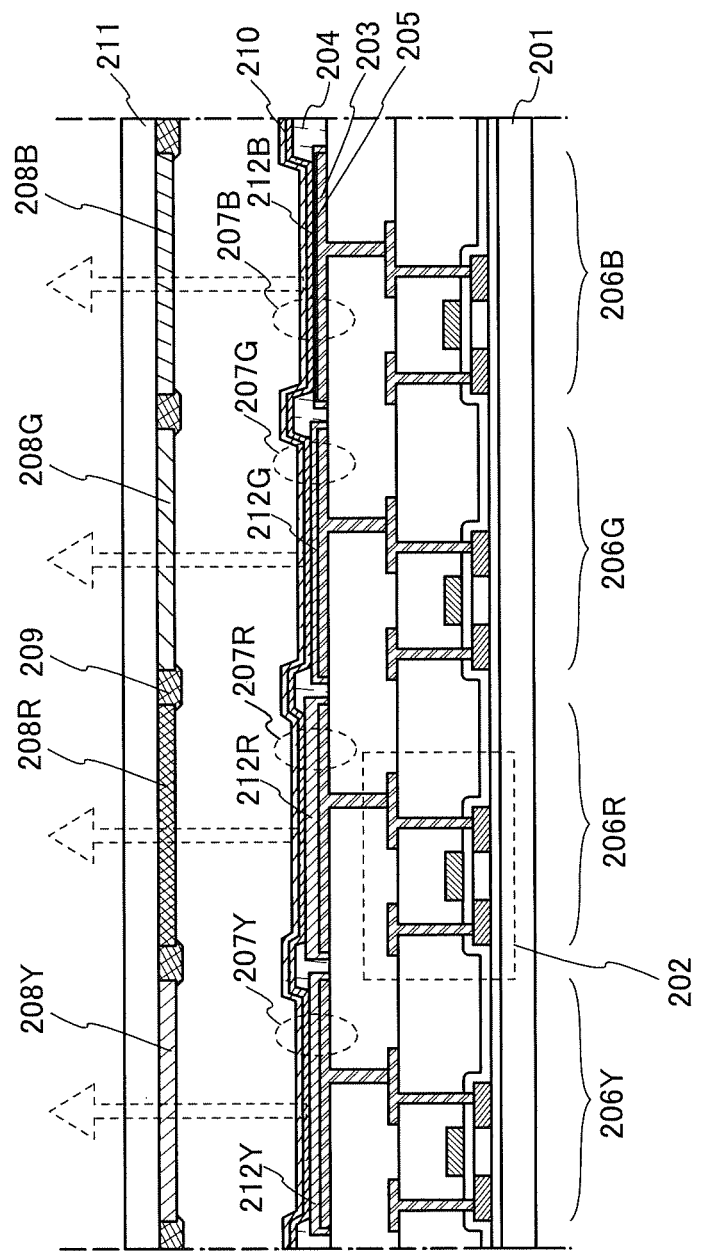
FIG. 2 illustrates a structure of a pixel portion of a light-emitting device.

In FIG. 2, a plurality of FETs 202 is formed over a substrate 201. Each of the FETs 202 is electrically connected to a light-emitting element (207R, 207G, 207B, or 207Y).

Specifically, each of the FETs 202 is electrically connected to a first electrode 203 that is a pixel electrode of a light-emitting element. A partition wall 204 is provided so as to cover edge portions of adjacent first electrodes 203.

The structure of the first electrode 203 in this embodiment is the same as that described in Embodiment 1 and the first electrode 203 serves as a reflective electrode. Conductive films (212B, 212G, 212R, and 212Y) which are transparent conductive films are formed as a part of the respective first electrodes 203. The thicknesses of conductive films (212B, 212G, 212R, and 212Y) are each adjusted so that the optical path length between the first electrode 203 and the second electrode 210 of each light-emitting element (207R, 207G, 207B, or 207Y) permits the amplification of light which is desired to be extracted. However, the optical adjustment may be carried out by individual EL layers without the formation of the conductive film. An EL layer 205 is formed over the first electrode 203 and the conductive film (212B, 212G, 212R, or 212Y), and the second electrode 210 is formed over the EL layer 205. The structures of the EL layer 205 and the second electrode 210 are the same as those described in Embodiment 1. The EL layer includes a plurality of light-emitting layers which emits a plurality of monochromatic lights. The second electrode 210 is an electrode which serves as a semi-transmissive and semi-reflective electrode.

The light-emitting elements (207R, 207G, 207B, and 207Y) emit light of different colors. Specifically, the light-emitting element 207R is optically adjusted to selectively emit red light, and in a region indicated by 206R, red light is emitted through a color filter 208R in the direction indicated by an arrow. The light-emitting element 207G is optically adjusted to selectively emit green light, and in a region indicated by 206G, green light is emitted through a color filter 208G in the direction indicated by an arrow. The light-emitting element 207B is optically adjusted to selectively emit blue light, and in a region indicated by 206B, blue light is emitted through a color filter 208B in the direction indicated by an arrow. The light-emitting element 207Y may be optically adjusted to selectively emit yellow light so that in a region indicated by 206Y, yellow light is emitted through a color filter 208Y in the direction indicated by an arrow.

As shown in FIG. 2, each of the color filters 208R, 208G, 208B, and 208Y is provided on a transparent sealing substrate 211 that is provided above the substrate 201 over which light emitting elements 207R, 207G, 207B, and 207Y are formed. The color filters (208R, 208G, 208B, and 208Y) are provided so as to overlap with the light-emitting elements (207R, 207G, 207B, and 207Y) which exhibit different emission colors, respectively.

A black layer (black matrix) 209 may be provided so as to cover edge portions of adjacent color filters (208R, 208G, 208B, and 208Y). The color filters (208R, 208G, 208B, and 208Y) and the black layer 209 may be covered with an overcoat layer that is formed using a transparent material.

The above-described light-emitting device has a structure in which light is extracted from the sealing substrate 211 side (a top emission structure). Thus, a light-shielding substrate or a transparent substrate can be used for the substrate 201.

According to the above-described structure, it is possible to obtain a light-emitting device which is capable of exhibiting different emission colors (red, blue, green, and yellow) although the same EL layer is shared. Additionally, a white-emissive light-emitting element with low power consumption can be obtained. Therefore, the above structure does not require the side-by-side patterning and is advantageous for full color display owing to easiness in achieving higher resolution display or the like.

(Embodiment 3)

In this embodiment, one embodiment of a light-emitting device in which the light-emitting element described in Embodiment 1 is combined with a color filter or the like is described. In this embodiment, a structure of a pixel portion of the light-emitting device is described with reference to FIG. 12.

Figure 12:
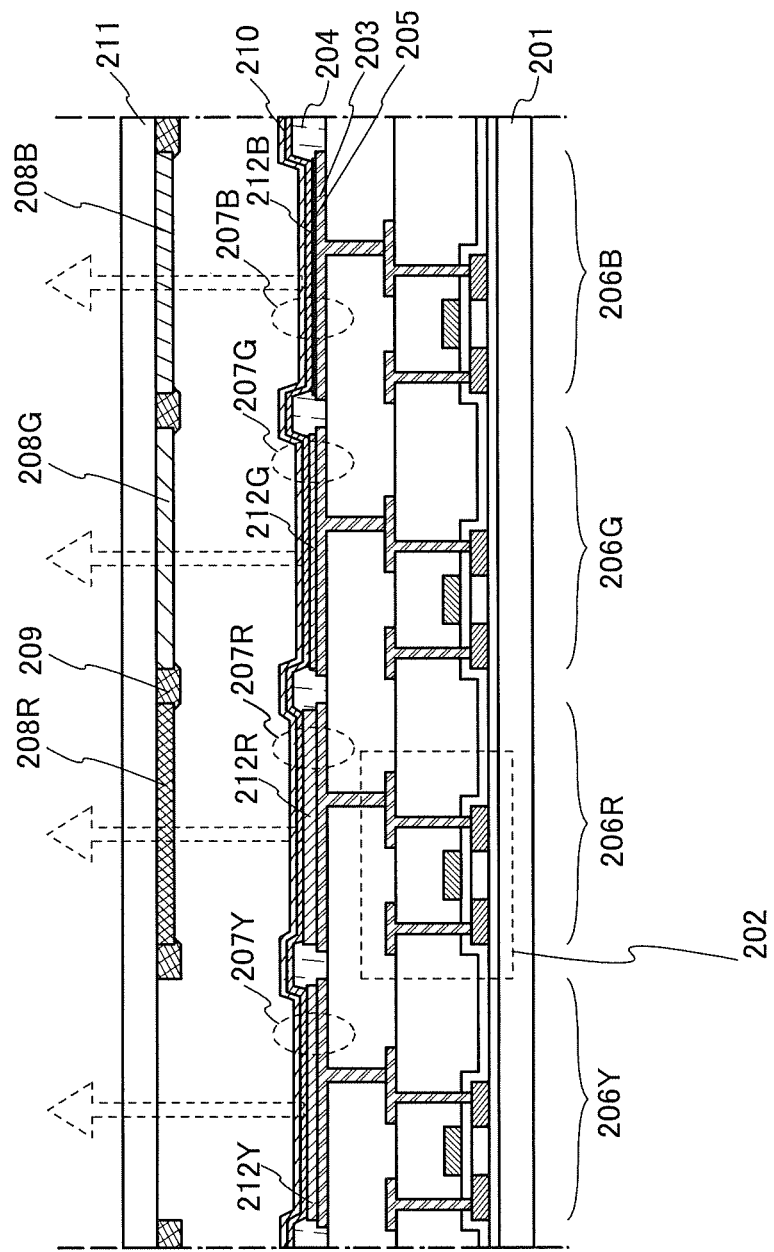
FIG. 12 illustrates a structure of a pixel portion of a light-emitting device.

In FIG. 12, a plurality of FETs 202 is formed over a substrate 201. Each of the FETs 202 is electrically connected to a light-emitting element (207R, 207G, 207B, or 207Y). Specifically, each of the FETs 202 is electrically connected to a first electrode 203 that is a pixel electrode of a light-emitting element. A partition wall 204 is provided so as to cover edge portions of adjacent first electrodes 203.

The structure of the first electrode 203 in this embodiment is the same as that described in Embodiment 1 and the first electrode 203 serves as a reflective electrode. Conductive films (212B, 212G, 212R, and 212Y) which are transparent conductive films are formed as a part of the respective first electrodes 203. The thicknesses of conductive films (212B, 212G, 212R, and 212Y) are each adjusted so that the optical path length between the first electrode 203 and the second electrode 210 of each light-emitting element (207R, 207G, 207B, or 207Y) allows the amplification of light which is desired to be extracted. However, in optical adjustment, the optical adjustment may be carried out by each EL layer without the formation of the conductive film. Further, an EL layer 205 is fonned over the first electrode 203 and the conductive film (212B, 212G, 212R, or 212Y), and the second electrode 210 is formed over the EL layer 205. The structures of the EL layer 205 and the second electrode 210 are also the same as those described in Embodiment 1. The EL layer includes a plurality of light-emitting layers emitting a plurality of monochromatic lights. The second electrode 210 is an electrode which serves as a semi-transmissive and semi-reflective electrode.

The light-emitting elements (207R, 207G, 207B, and 207Y) emit light with different colors. Specifically, the light-emitting element 207R is optically adjusted to emit red light, and in a region indicated by 206R, red light is emitted through a color filter 208R in the direction indicated by an arrow. In addition, the light-emitting element 207G is optically adjusted to emit green light, and in a region indicated by 206G, green light is emitted through a color filter 208G in the direction indicated by an arrow. The light-emitting element 207B is optically adjusted to emit blue light, and in a region indicated by 206B, blue light is emitted through a color filter 208B in the direction indicated by an arrow. The light-emitting element 207Y is optically adjusted to emit yellow light, and in a region indicated by 206Y, yellow light is emitted in the direction indicated by an arrow without a color filter.

As shown in FIG. 12, the color filters (208R, 208G, and 208B) are provided on a transparent sealing substrate 211 that is provided above the substrate 201 over which light emitting elements (207R, 207G, and 207B) are formed. The color filters (208R, 208G, and 208B) are provided in positions overlapping with the corresponding light-emitting elements (207R, 207G, and 207B) which exhibit different emission colors.

A black layer (black matrix) 209 is provided so as to cover edge portions of adjacent color filters (208R, 208G, and 208B). The color filters (208R, 208G, and 208B), and the black layer 209 may be covered with an overcoat layer that is formed using a transparent material.

The above-described light-emitting device has a structure in which light is extracted from the sealing substrate 211 side (a top emission structure). Thus, a light-shielding substrate or a transparent substrate can be used for the substrate 201.

According to the above-described structure, a light-emitting device which includes light-emitting elements exhibiting different emission colors (red, blue, green, and yellow), which also emits white light with high efficiency by combination of these emission colors can be obtained.

(Embodiment 4)

In this embodiment, as an example of a light-emitting device that is one embodiment of the present invention, an active matrix light-emitting device is described with reference to FIGS. 3A to 3C. The light-emitting element described in Embodiment 1 can be used for the light-emitting device in this embodiment. Note that not only an active matrix light-emitting device but also a passive matrix light-emitting device is included in the light-emitting device of an embodiment of the invention.

Figure 3A:
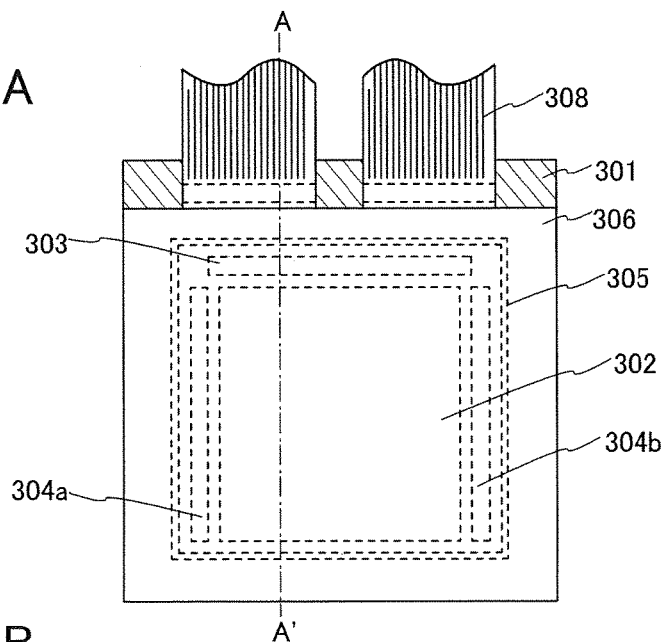
FIGS. 3A to 3C illustrate a light-emitting device.
Figure 3B:
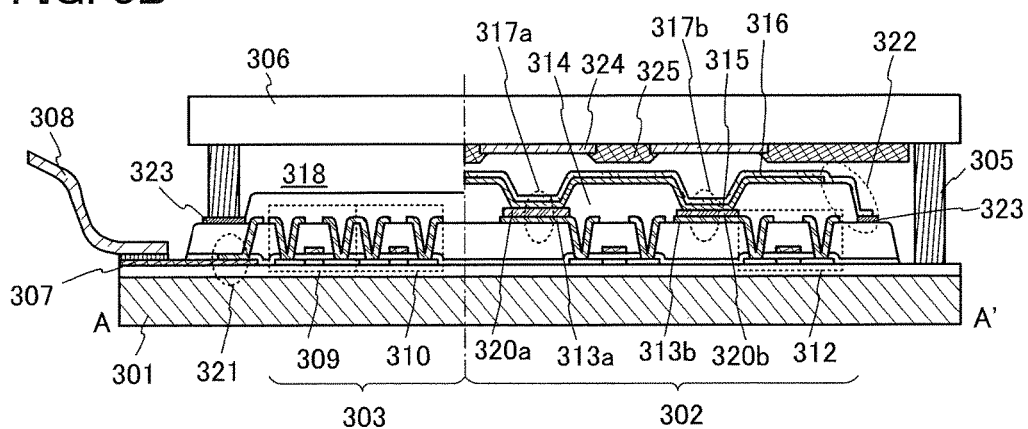

FIG. 3A is a top view illustrating the light-emitting device, and FIG. 3B is a cross-sectional view taken along the chain line A-A' in FIG. 3A. The active matrix light-emitting device according to this embodiment includes a pixel portion 302 provided over an element substrate 301, a driver circuit portion (a source line driver circuit) 303, and driver circuit portions (gate line driver circuits) 304a and 304b. The pixel portion 302, the driver circuit portion 303, and the driver circuit portions 304a and 304b are sealed between the element substrate 301 and a sealing substrate 306 with a sealant 305.

Over the element substrate 301, a lead wiring 307 for connecting an external input terminal, through which a signal (e.g., a video signal, a clock signal, a start signal, a reset signal, or the like) or an electric potential is transmitted to the driver circuit portion 303 and the driver circuit portion 304, is provided. Here is shown an example in which a flexible printed circuit (FPC) 308 is provided as the external input terminal. Although only the FPC is shown here, the FPC may be provided with a printed wiring board (PWB). The light-emitting device in this specification includes not only a main body of the light-emitting device but also the light emitting device with an FPC or a PWB attached.

Next, a cross-sectional structure will be explained with reference to FIG. 3B. The driver circuit portions and the pixel portion are formed over the element substrate 301; here, the driver circuit portion 303 which is the source line driver circuit, and the pixel portion 302 are illustrated.

The driver circuit portion 303 shown here is an example in which an FET 309 and an FET 310 are combined. The driver circuit portion 303 including the FET 309 and the FET 310 may be formed with a circuit including transistors having the same conductivity type (either an n-channel transistor or a p-channel transistor) or a CMOS circuit including an n-channel transistor and a p-channel transistor. Although a driver integrated type in which the driver circuit is formed over the element substrate is described in this embodiment, the driver circuit may not necessarily be formed over the element substrate, and the driver circuit can be formed outside the element substrate.

The pixel portion 302 includes a switching FET (not shown) and a current control FET 312, and a wiring of the current control FET 312 (a source electrode or a drain electrode) is electrically connected to first electrodes (anodes) (313a and 313b) of light-emitting elements 317a and 317b. Although the pixel portion 302 includes two FETs (the switching FET and the current control FET 312) per one light-emitting element, one embodiment of the present invention is not limited thereto. Three or more FETs and a capacitor may be provided for each light-emitting element.

As the FETs 309, 310, and 312, for example, a staggered transistor or an inverted staggered transistor can be used. Examples of a semiconductor material that can be used for the FETs 309, 310, and 312 include Group 13 semiconductors (e.g., gallium), Group 14 semiconductors (e.g., silicon), compound semiconductors, oxide semiconductors, and organic semiconductors. There is no particular limitation on the crystallinity of the semiconductor material, and an amorphous semiconductor film or a crystalline semiconductor film can be used. In particular, an oxide semiconductor is preferably used for the FETs 309, 310, and 312. Examples of the oxide semiconductor include an In-Ga oxide and an In-M-Zn oxide (M is Al, Ga, Y, Zr, La, Ce, or Nd). For example, an oxide semiconductor material that has an energy gap of 2 eV or more, preferably 2.5 eV or more, further preferably 3 eV or more is used for the FETs 309, 310, and 312, so that the off-state current of the transistors can be reduced.

There is no particular limitation on the type of the element substrate 301. Examples of the substrate include a semiconductor substrate (e.g., a single crystal substrate or a silicon substrate), an SOI substrate, a glass substrate, a quartz substrate, a plastic substrate, a metal substrate such as a stainless steel substrate and stainless steel foil, a flexible substrate such as an attachment film, paper including a fibrous material, and a base material film. Examples of the glass substrate include a barium borosilicate glass substrate, an aluminoborosilicate glass substrate, and a soda lime glass substrate. Examples of the flexible substrate include plastics represented by poly(ethylene terephthalate) (PET), poly (ethylene naphthalate) (PEN), a poly (ether sulfone) (PES), polypropylene, a polyester; poly(vinyl fluoride), poly(vinyl chloride), a polyamide; a polyimide; an aramid; an epoxy resin, and the like. An inorganic vapor deposition film and paper are also exemplified as a flexible substrate.

The use of a semiconductor substrate, a single crystal substrate, an SOI substrate, or the like enables the manufacture of small-sized transistors with a small variation in characteristics, size, shape, or the like. A circuit using such transistors achieves lower power consumption of the circuit or higher integration of the circuit.

When the above-described flexible substrate is used as the element substrate 301, the light-emitting element or the transistor may be directly formed over the flexible substrate. Alternatively, part of or the entire light-emitting element or the transistor may be formed over a base substrate with a separation layer provided therebetween and then the light-emitting element or the transistor may be separated from the base substrate and transferred to another substrate. By this separation and transfer method with a separation layer, the light-emitting element or the transistor can be formed over a substrate having low heat resistance or a flexible substrate having difficulty in direct formation of the light-emitting element or the transistor over that. For the above separation layer, a stack of inorganic films including a tungsten film and a silicon oxide film, or an organic resin film such as a polyimide or the like can be used, for example.

The first electrode has a structure in which a conductive film 313 as a reflective electrode and a conductive film 320 for optical adjustment are stacked. For example, as illustrated in FIG. 3B, the wavelengths of light extracted from the light-emitting elements 317*a* and 317*b* are different from each other; thus, conductive films 320*a* and 320*b* are formed so that the thicknesses thereof are different from each other. A partition wall 314 formed of an insulating material is formed so as to cover an edge portions of the first electrodes (313 and 320). In this embodiment, the partition wall 314 is formed using a positive photosensitive acrylic resin. In this embodiment, the first electrodes (313 and 320) are used as anodes.

The partition wall 314 preferably has a curved surface with curvature at an upper end portion or a lower end portion thereof. This enables the favorable coverage of a film to be formed over the partition wall 314. The partition wall 314 can be formed using, for example, either a negative photosensitive resin or a positive photosensitive resin. The material of the partition wall 314 is not limited to an organic compound and an inorganic compound such as silicon oxide, silicon oxynitride, or silicon nitride can also be used.

An EL layer 315 and a second electrode 316 are stacked over the first electrodes (313 and 320). An edge portion of the EL layer 315 that is shared by the light-emitting elements (317*a* and 317*b*) is covered with the second electrode 316. The structure of the EL layer 315 is the same as that described in Embodiment 1.

For the first electrode (313 and 320), the EL layer 315, and the second electrode 316, any of the materials listed in Embodiment 1 can be used. The first electrodes (313 and 320) of the light-emitting elements (317*a* and 317*b*) are electrically connected, through the driver circuit portion 303, to a lead wiring 307 in a region 321, and an external signal is input to the first electrodes (313*a* and 313*b*) of the light-emitting elements (317*a* and 317*b*) through an FPC 308. Further, the second electrode 316 in the light-emitting elements (317*a* and 317*b*) is electrically connected to a lead wiring 323 in a region 322, and an external signal is input through the FPC 308 although it is not shown.

Although the cross-sectional view of FIG. 3B illustrates only two light-emitting elements 317, a plurality of light-emitting elements described in Embodiment 2 is arranged in matrix in the pixel portion 302. That is, light-emitting elements that provide four kinds of colors (R, G, B, and Y) are formed in the pixel portion 302, whereby a light-emitting device capable of full color display can be obtained.

The sealing substrate 306 is attached to the element substrate 301 with the sealant 305, whereby the light-emitting element 317 is provided in a space 318 surrounded by the element substrate 301, the sealing substrate 306, and the sealant 305.

A color filter 324 is provided for the sealing substrate 306, and black layer (black matrix) 325 is provided between adjacent color filters. Note that light emission obtained from the light-emitting elements 317*a* and 317*b* is extracted through the color filter 324.

Note that the space 318 may be filled with an inert gas (such as nitrogen and argon) or the sealant 305.

An epoxy-based resin or glass frit is preferably used for the sealant 305. The material preferably allows as little moisture and oxygen as possible to permeate. As the sealing substrate 306, a glass substrate, a quartz substrate, or a plastic substrate formed of fiber reinforced plastic (FRP), polyvinyl fluoride) (PVF), a polyester, an acrylic resin, or the like can be used. In the case where glass frit is used as the sealant, the element substrate 301 and the sealing substrate 306 are preferably glass substrates for high adhesion.

Figure 3C:
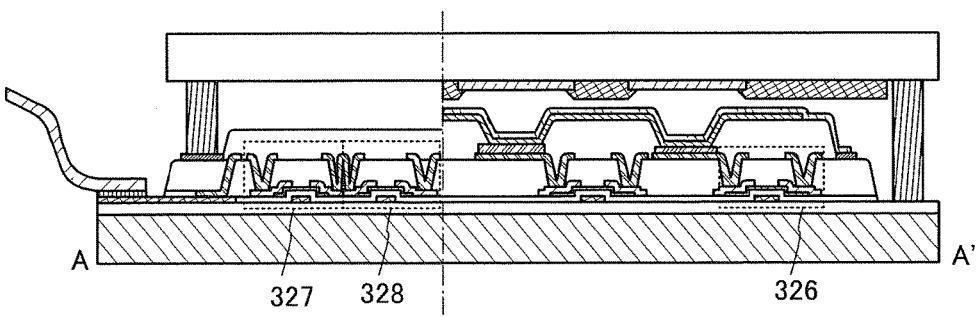

The FETs electrically connected to the light-emitting elements may be a FET 326, a FET 327, and a FET 328 as illustrated in FIG. 3C.

As described above, an active matrix light-emitting device can be obtained.

Note that the structure described in this embodiment can be combined as appropriate with any of the structures described in the other embodiments.

(Embodiment 5)

In this embodiment, examples of a variety of electronic devices that are completed using a light-emitting device according to one embodiment of the present invention will be described with reference to FIGS. 4A, 4B, 4C, 4D, 4D'-1, and 4D'-2.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, stationary game machines such as pin-ball machines, and the like.

Figure 4A:
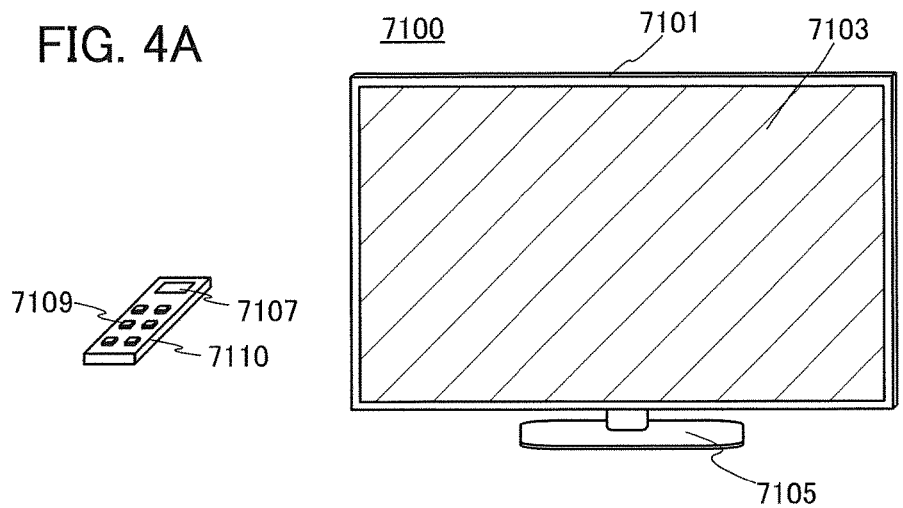
FIGS. 4A, 4B, 4C, 4D, 4D'-1, and 4D'-2 illustrate electronic devices.

FIG. 4A illustrates an example of a television device. In a television device 7100, a display portion 7103 is incorporated in a housing 7101. Images can be displayed by the display portion 7103, and the light-emitting device can be used for the display portion 7103. Here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

The television device 7100 may be provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

Figure 4B:
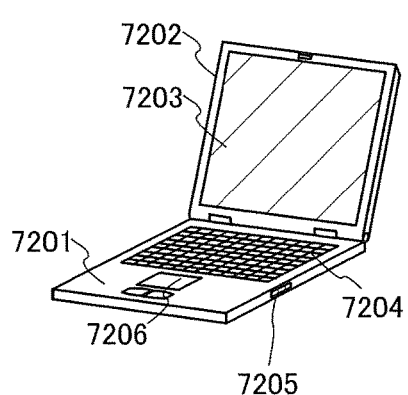

FIG. 4B illustrates a computer, which includes a main body 7201, a housing 7202, a display portion 7203, a keyboard 7204, an external connection port 7205, a pointing device 7206, and the like. This computer can be manufactured using the light-emitting device for the display portion 7203.

Figure 4C:
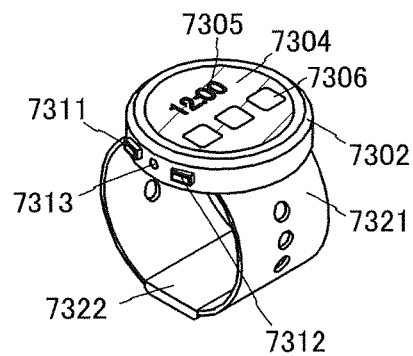

FIG. 4C illustrates a smart watch. The smart watch includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The smart watch in FIG. 4C can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting device for the display panel 7304.

Figure 4D:
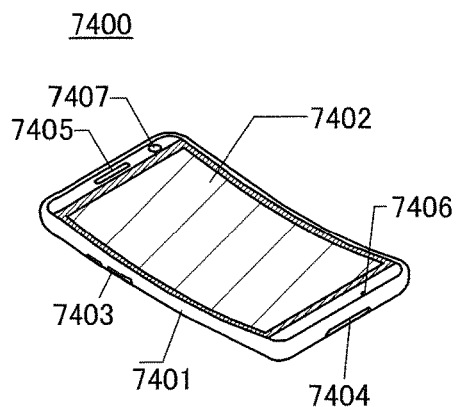
Figure 4D:
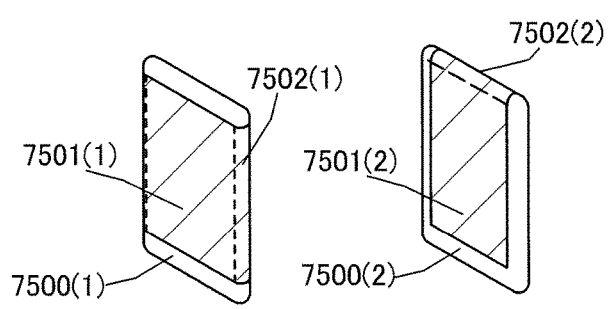

FIG. 4D, 4D'-1, and 4D'-2 illustrates an example of a mobile phone (e.g., smartphone). A mobile phone 7400 includes a housing 7401 provided with a display portion 7402, a microphone 7406, a speaker 7405, a camera 7407, an external connection portion 7404, an operation button 7403, and the like. In the case where a light-emitting device is manufactured by forming a light-emitting element of one embodiment of the present invention over a flexible substrate, the light-emitting element can be used for the display portion 7402 with a curved surface as illustrated in FIG. 4D.

When the display portion 7402 of the cellular phone 7400 illustrated in FIG. 4D is touched with a finger or the like, data can be input to the cellular phone 7400. Operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor (e.g., a gyroscope or an acceleration sensor) is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

In the input mode, if an optical sensor in the display portion 7402 judges that the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. When a backlight or a sensing light source which emits near-infrared light is provided in the display portion, an image of a finger vein, a palm vein, or the like can be taken.

The light-emitting device can be used for a mobile phone having a structure illustrated in FIG. 4D'-1 or FIG. 4D'-2, which is another structure of the mobile phone (e.g., smartphone).

Note that in the case of the structure illustrated in FIG. 4D'-1 or FIG. 4D'-2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the mobile phone is placed in user's breast pocket.

Figure 5A:
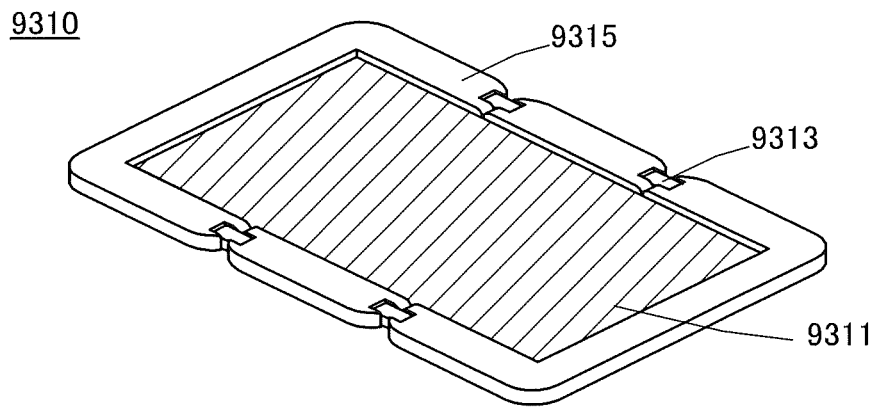
FIGS. 5A to 5C illustrate an electronic device.
Figure 5B:
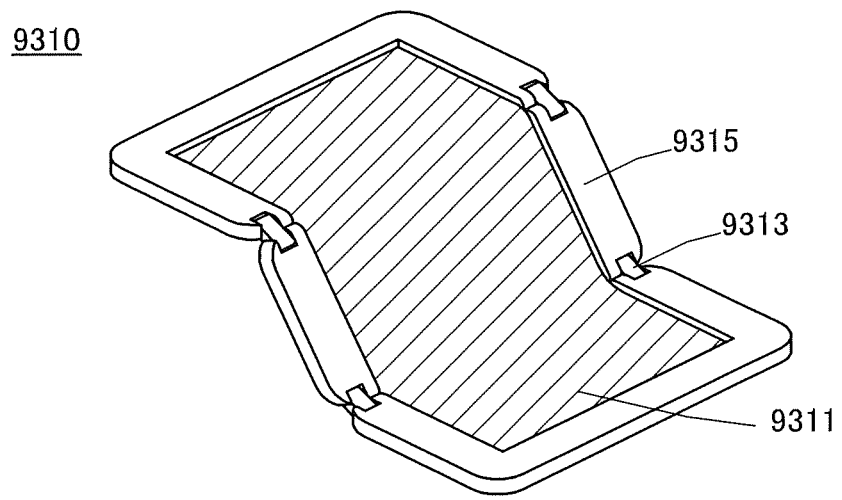
Figure 5C:
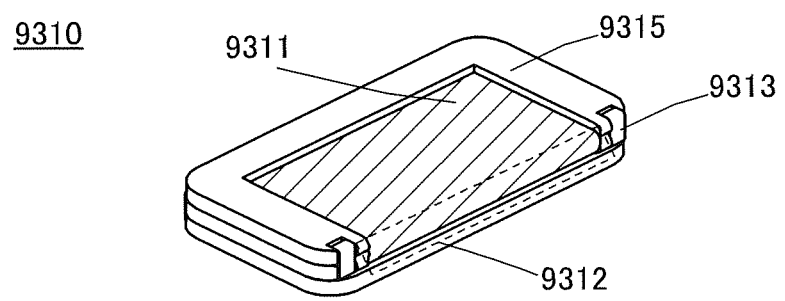

FIGS. 5A to 5C illustrate a foldable portable information terminal 9310. FIG. 5A illustrates the portable information terminal 9310 that is opened. FIG. 5B illustrates the portable information terminal 9310 that is being opened or being folded. FIG. 5C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. By folding the portable information terminal 9310 at a connection portion between two housings 9315 with the hinges 9313, the portable information terminal 9310 can be reversibly changed in shape from an opened state to a folded state. A light-emitting device of one embodiment of the present invention can be used for the display panel 9311. A display region 9312 is a display region that positioned at a side surface of the portable information terminal 9310 that is folded. On the display region 9312, information icons, file shortcuts of frequently-used applications, and the like can be displayed, and confirmation of information and start of application can be smoothly performed.

As described above, the light-emitting device according to one embodiment of the present invention can be used for electronic devices in a variety of fields without being limited to those described in this embodiment.

Note that the structure described in this embodiment can be combined as appropriate with any of the structures described in the other embodiments.

(Embodiment 6)

In this embodiment, examples of a lighting device to which a light-emitting device according to one embodiment of the present invention is applied will be described with reference to FIG. 6.

Figure 6:
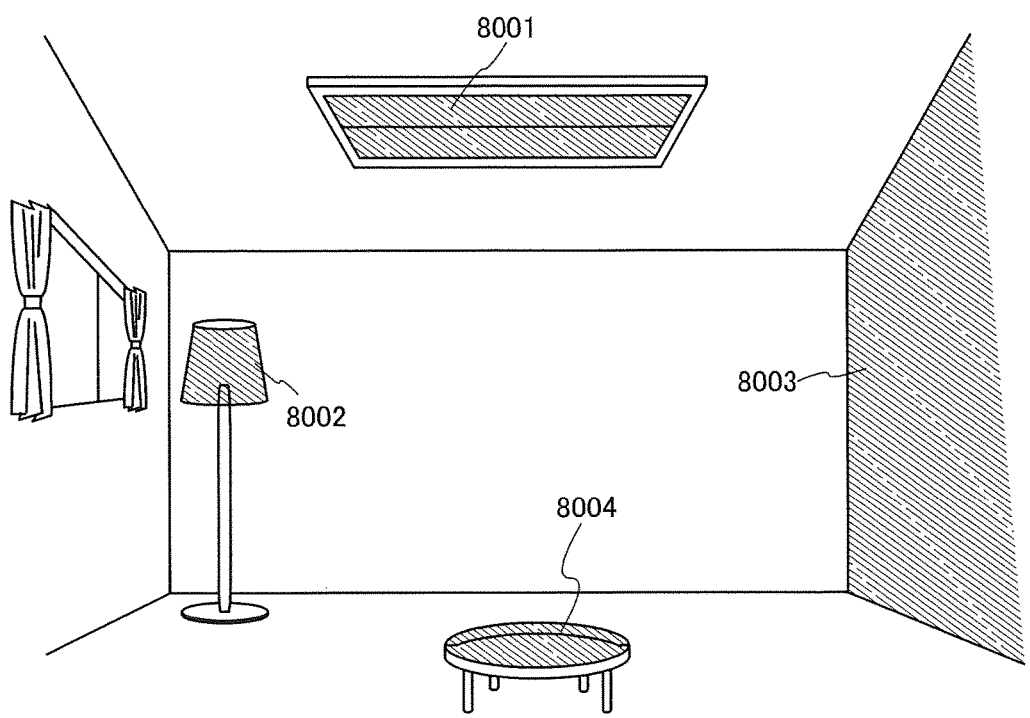
FIG. 6 illustrates lighting devices.

FIG. 6 illustrates an example in which a light-emitting device is used for an interior lighting device 8001. Since the area of the light-emitting device can be increased, a lighting device having a large area can also be formed. A lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

When the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text disclosed in the specification.

Note that by combining a diagram (or may be part of the diagram) described in one embodiment with another part of the diagram, a different diagram (or may be part of the different diagram) described in the embodiment, and/or a diagram (or may be part of the diagram) described in one or a plurality of different embodiments, much more diagrams can be formed.

Note that a content which is not specified in any drawing or text in the specification can be excluded from one embodiment of the invention. When the range of a value that is defined by the maximum and minimum values is described, the range may be appropriately narrowed or part of the range may be excluded, whereby one embodiment of the invention excluding part of the range can be constructed. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description of a value, "a voltage is preferably 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the film is a conductive film is excluded from one embodiment of the invention. For example, it can be specified that the case where the film is a semiconductor film is excluded from one embodiment of the invention.

As another specific example, a description of a stacked-layer structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where there are several possible portions to which a terminal is connected, it is not necessary to specify all the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least a connection portion of a circuit is specified. Alternatively, it might be possible for those skilled in the art to specify the invention when at least a function of a circuit is specified. In other words, when a function of a circuit is specified, one embodiment of the invention can be clear. Further, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute one embodiment of the invention. Thus, in the case where a diagram or a text describing a certain portion is disclosed, a content taken out from part of the diagram or the text is also disclosed as one embodiment of the invention, and one embodiment of the invention can be constituted. The embodiment of the invention is clear. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, whereby one embodiment of the invention can be constituted. For example, M circuit elements (e.g., transistors or capacitors) (M is an integer) are picked up from a circuit diagram in which N circuit elements (e.g., transistors or capacitors) (N is an integer, where M<N)

are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is given in a diagram or a text described in one embodiment in this specification and the like, it will be readily appreciated by those skilled in the art that a broader concept of the specific example can be derived. Therefore, in the case where at least one specific example is given in the diagram or the text described in one embodiment, a broader concept of the specific example is disclosed as one embodiment of the invention and can constitute one embodiment of the invention. The embodiment of the invention is clear.

Note that in this specification and the like, what is illustrated in at least a diagram (which may be part of the diagram) is disclosed as one embodiment of the invention, and one embodiment of the invention can be constituted. Therefore, when a certain content is illustrated in a diagram, the content is disclosed as one embodiment of the invention even without text description and can constitute one embodiment of the invention. In a similar manner, part of a diagram, which is taken out from the diagram, is disclosed as one embodiment of the invention, and one embodiment of the invention can be constituted. The embodiment of the invention is clear.

EXAMPLE 1

In this example, light-emitting elements 1 to 5 (LEE 1 to 5) which are embodiments of the present invention were fabricated. The element structure is described in detail with reference to FIG. 1. Chemical formulae of materials used in Example 1 are shown below.

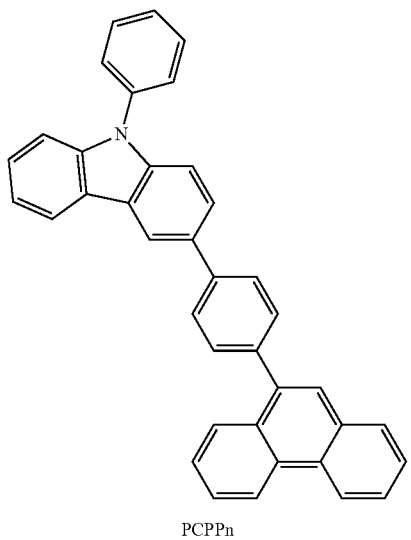

PCPPn

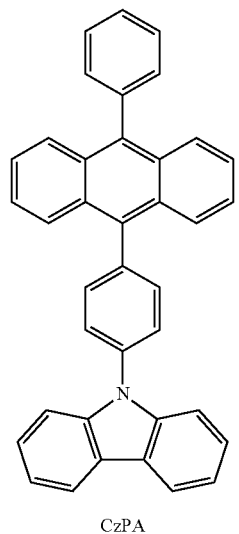

CzPA

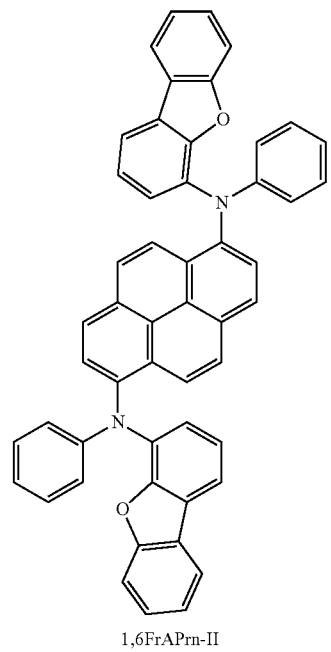

1,6FrAPrn-II

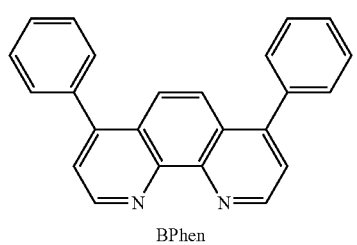

BPhen

-continued

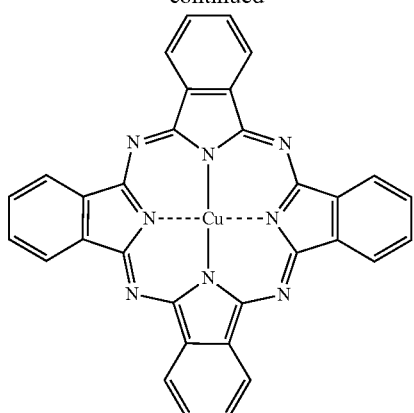
CuPc

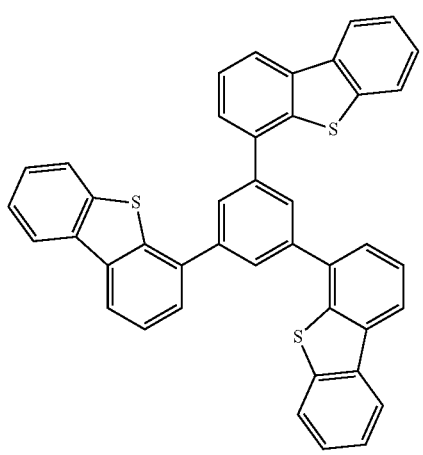
DBT3P-II

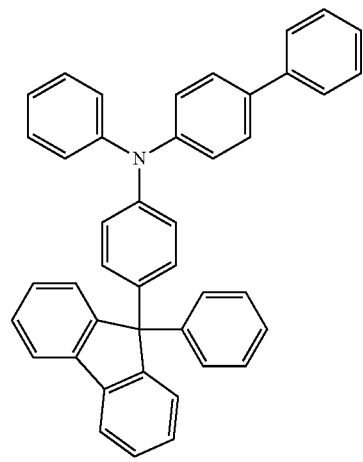
BPAFLP

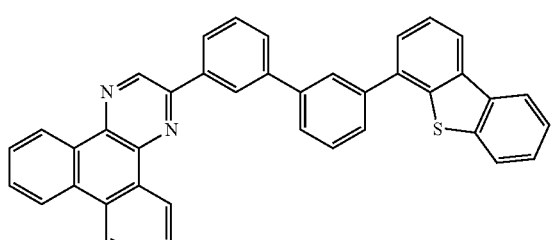
2mDBTBPDBq-II

-continued

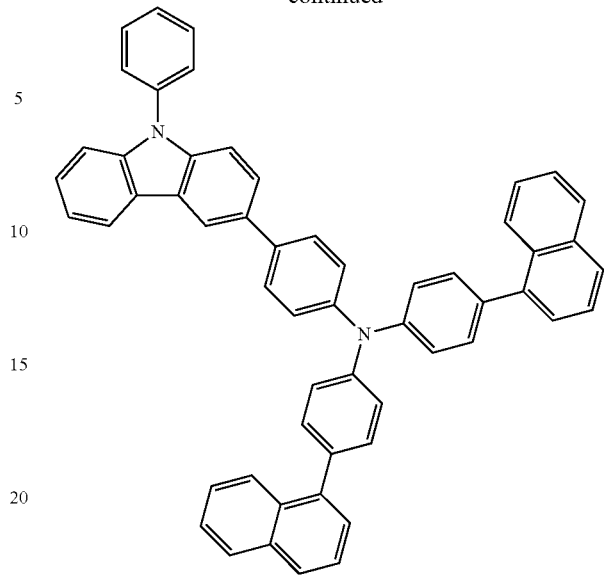
PCBNBB

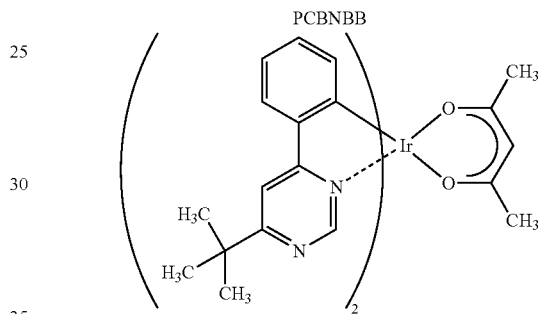
[Ir(tBuppm)$_2$(acac)]

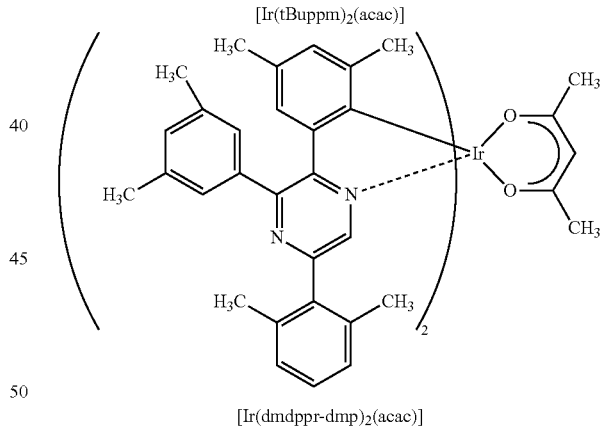
[Ir(dmdppr-dmp)$_2$(acac)]

(Fabrication of Light-Emitting Elements 1 to 5)

FIG. 1 shows a stacked-layer structure of light-emitting elements 1 to 5 to be described in this example. The light-emitting elements 1 to 5 were optically adjusted so that the light-emitting element 1 emitted red light, the second light-emitting element 2 emitted green light, the third light-emitting element emitted blue light, and the fourth and the fifth light-emitting elements emitted yellow light. Specifically, for the optical adjustment, the thicknesses of the first electrode 101 and the hole-injection layer 104a formed over a substrate were changed in each light-emitting element. Each of the light-emitting elements has a structure in which light is emitted from the second electrode 102 side. Although not shown in FIG. 1, a color filter for extracting red light was provided over a second electrode 102 of the first light-emitting element 1, a color filter for extracting green light was provided over the second electrode 102 of the light-emitting element 2, and a color filter for extracting blue light was provided over the second electrode 102 of the third light-emitting element 3. Light emission with high color purity corresponding to each emission color was obtained. Further, a color filter for extracting yellow light was provided over the second electrode 102 of the fourth light-emitting element 4, and yellow light emission was obtained from the second electrode 102 side. A color filter was not provided over the second electrode of the light-emitting element 5. Thus, the light of the light-emitting element 5 is extracted outside without a color filter.

The first electrode 101 serves as an anode, which was formed in the following manner. An alloy film of aluminum (Al), nickel (Ni), and lanthanum (La) (Al-Ni-La alloy film) with a thickness of 200 nm was deposited over a glass substrate by a sputtering method, a film of titanium (Ti) with a thickness of 6 nm was deposited by a sputtering method, and then a film of indium tin oxide containing silicon oxide (ITSO) was deposited by a sputtering method. The thicknesses of ITSO of the light-emitting elements 1 to 5 were set to 75 nm, 40 nm, 10 nm, 40 nm, and 40 nm, respectively. At this time, the film of Ti was partially or entirely oxidized and contained titanium oxide. The electrode area was set to 4 mm$^2$ (2 mm×2 mm).

As pretreatment, a surface of the substrate was washed with water, baking was performed at 200° C. for one hour, and then UV ozone treatment was performed for 370 seconds. After that, the substrate was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate was cooled down for about 30 minutes.

The first EL layer 103a, the electron relay layer 109, the second EL layer 103b, and the second electrode 102 were sequentially formed over the first electrode 101. The first EL layer 103a includes the hole-injection layer 104a, the hole-transport layer 105a, the light-emitting layer 106a, the electron-transport layer 107a, and the electron-injection layer 108a. The second EL layer 103b includes the hole-injection layer 104b, the hole-transport layer 105b, the light-emitting layers 106b, the electron-transport layer 107b, and the electron-injection layer 108b. In this example, the hole-injection layer 104a, the hole-transport layer 105a, the light-emitting layer 106a, the electron-transport layer 107a, the electron-injection layer 108a, the hole-injection layer 104b, the hole-transport layer 105b, the light-emitting layers 106b, the electron-transport layer 107b, and the electron-injection layer 108b are respectively referred to as a first hole-injection layer, a first hole-transport layer, a light-emitting layer (A), a first electron-injection layer, a first electron-injection layer, a second hole-injection layer, a second hole-transport layer, a light-emitting layer (B), a second electron-transport layer, and a second electron-injection layer.

After reducing the pressure in the vacuum evaporation apparatus to 10$^{-4}$ Pa, 3-[4-(9-phenanthryl)-phenyl]-9-phenyl-9H-carbazole (abbreviation: PCPPn) and molybdenum oxide were co-evaporated at a mass ratio of 1:0.5 (PcPPn (abbreviation): molybdenum oxide), whereby the first hole-injection layer 104a was formed over the first electrode 101. Note that the co-evaporation method is an evaporation method by which a plurality of different substances is concurrently vaporized from different evaporation sources.

The thicknesses of the first hole-injection layers 104a of the light-emitting elements 1, 2, 3, 4, and 5 were set to 20 nm, 25 nm, 10 nm, 30 nm, and 30 nm, respectively.

Over the first hole-injection layer 104a, the hole-transport layer 105a was formed by evaporation of PCPPn to a thickness of 10 nm.

The light-emitting layer (A) 106a was formed to a thickness of 25 nm by co-evaporation of 9-[4-(10-phenyl-9-anthracenyl)phenyl]-9H-carbazole (abbreviation: CzPA) and N,N'-bis(dibenzofuran-4-yl)-N,N'-diphenyl-pyrene-1,6-diamine (abbreviation: 1,6FrAPrn-II) at a mass ratio of 1:0.05 (=CzPA: 1,6FrAPrn-II) over the first hole-transport layer 105a.

The first electron-transport layer 107a was formed in such a manner that over the light-emitting layer (A) 106a, a film of CzPA was formed by evaporation to a thickness of 5 nm and then a film of bathophenanthroline (abbreviation: BPhen) was formed by evaporation to a thickness of 15 nm.

Over the first electron-transport layer 107a, a film of lithium oxide (Li$_2$O) was formed by evaporation to a thickness of 0.1 nm to form the first electron-injection layer 108a. After that, a film of copper phthalocyanine (abbreviation: CuPc) was formed by evaporation to a thickness of 2 nm to form the electron relay layer 109. Then, the second hole-injection layer 104b was formed to a thickness of 12.5 nm by co-evaporation of 1,3,5-tri(dibenzothiophen-4-yl)benzene (abbreviation: DBT3P-II) and molybdenum oxide at a mass ratio of 1:0.5 (DBT3P-II: molybdenum oxide). The whole or a part of the region including the first electron-transport layer 107a, the electron relay layer 109, and the second hole-injection layer 104b functions as the charge-generation layer.

Over the second hole-injection layer 104b, a film of BPAFLP was formed by evaporation to a thickness of 20 nm to form the second hole-transport layer 105b.

The light-emitting layer (B) 106b had a stacked-layer structure of two layers of the light-emitting layer 106b1 and the light-emitting layer 106b2. In this example, they are referred to a first light-emitting layer and a second light-emitting layer, respectively.

The first light-emitting layer 106b1 was formed to a thickness of 20 nm over the second hole-transport layer 105b by co-evaporation of 2-[3'-(dibenzothiophen-4-yl)biphenyl-3-yl]dibenzo[f,h]quinoxaline (abbreviation: 2mDBTBPDBq-II), 4,4'-di(1-naphthyl)-4"-(9-phenyl-9H-carbazol-3-yl)triphenylamine (abbreviation: PCBNBB), and (acetylacetonato)bis(6-tert-butyl-4-phenylpyrimidinato) iridium(III) (abbreviation: Ir(tBuppm)$_2$(acac)) at a mass ratio of 0.7:0.3:0.06 (2mDBTBPDBq-II: PCBNBB: Ir(tBuppm)$_2$(acac)).

The second light-emitting layer 106b2 was formed to a thickness of 20 nm over the first light-emitting layer 106b1 by co-evaporation of 2mDBTBPDBq-II, and bis{4,6-dimethyl-2-[5-(2,6-dimethylphenyl)-3-(3,5-dimethylphenyl)-2-pyrazinyl-κN]phenyl-κC}(2,4-pentanedionato-κ$^2$O,O') iridium(III) (abbreviation: Ir(dmdppr-dmp)$_2$(acac)) at a mass ratio of 1:0.06 (2mDBTBPDBq-II: Ir(dmdppr-dmp)$_2$(acac)).

The second electron-transport layer 107b was formed in such a manner that over the second light-emitting layer 106b2, a film of 2mDBTBPDBq-II was formed by evaporation to a thickness of 30 nm and then a film of BPhen was formed by evaporation to a thickness of 15 nm.

Over the second electron-transport layer 107b, a film of lithium fluoride (LiF) was formed by evaporation to a thickness of 1 nm, so that an electron-injection layer 108b was formed.

The second electrode 102 was an electrode serving as a cathode and formed in such a manner that silver (Ag) and magnesium (Mg) were co-deposited at a mass ratio of 0.5:0.05 to a thickness of 15 nm over the second electron-injection layer 108b, and then indium tin oxide (ITO) was deposited to a thickness of 70 nm by a sputtering method. It is to be noted that an evaporation method using resistive heating was employed for all the evaporation steps. The thickness of each of the layers from the hole-transport layer 105a to the second electrode 102 was the same among the light-emitting elements 1 to 5.

Although not shown in FIG. 1, the color filters provided for the light-emitting elements 1 to 4 were formed over a counter substrate. The light-emitting elements were positioned so as to overlap with the color filters. Then, the substrate and the counter substrate were bonded and the light-emitting elements were sealed in a glove box containing a nitrogen atmosphere so as not to be exposed to the air (specifically, a sealant was applied on an outer edge of each element, and irradiation with ultraviolet light with a wavelength of 365 nm at 6 J/cm$^2$ and heat treatment at 80° C. for 1 hour were performed for sealing).

Table 1 shows the structure of the light-emitting elements 1 to 5 obtained through the above steps.

TABLE 1

Structures of the light-emitting elements (LEE) 1 to 5$^a$

| Layers | LEE 1 (R) | LEE 2 (G) | LEE 3 (B) | LEE 4 (Y) | LEE 5 (Y) |
|---|---|---|---|---|---|
| Color filter | R (2.36 mm) | G (1.29 nm) | B (0.78 nm) | Y (0.79 nm) | — |
| Second electrode | ITSO/ Ag:Mg (0.5:0.05) 70/15 nm | | | | |
| Second electron-injection layer | LiF 1 nm | | | | |
| Second electron-transport layer | BPhen/2mDBTBPDBq-II 15/30 nm | | | | |
| Second light-emitting layer | 2mDBTBPDBq-II:[Ir(dmdppr-dmp)$_2$(acac)] (1:0.06) 20 nm | | | | |
| First light-emitting layer | 2mDBTBPDBq-II:PCBNBB:[Ir(tBuppm)$_2$(acac)] (0.7:0.3:0.06) 20 nm | | | | |
| Second hole-transport layer | BPAFLP 20 nm | | | | |
| Second hole-injection layer | DBT3P-II:MoO$x$ (1:0.5) 12.5 nm | | | | |
| Electron relay layer | CuPc 2 nm | | | | |
| First electron-injection layer | Li$_2$O 0.1 nm | | | | |
| First electron-transport layer | BPhen/CzPA 15/5 nm | | | | |
| Light-emitting layer (A) | CzPA:1,6FrAPrn-II (1:0.05) 25 nm | | | | |
| First hole-transport layer | PCPPn 10 nm | | | | |
| First hole-injection layer | PCPPn:MoO$x$ (1:0.5) 20 nm | PCPPn:MoO$x$ (1:0.5) 25 nm | PCPPn:MoO$x$ (1:0.5) 10 nm | PCPPn:MoO$x$ (1:0.5) 30 nm | |
| | ITSO 75 nm | ITSO 405 nm | ITSO 10 nm | ITSO 40 nm | |
| First electrode | Ti/Al—Ni—La 6/200 nm | Ti/Al—Ni—La 6/200 nm | Ti/Al—Ni—La 6/200 nm | Ti/Al—Ni—La 6/200 nm | |

$^a$Parentheses are weight ratio of plural components.

(Operation Characteristics of Light-Emitting Elements 1 to 5)

Figure 7:
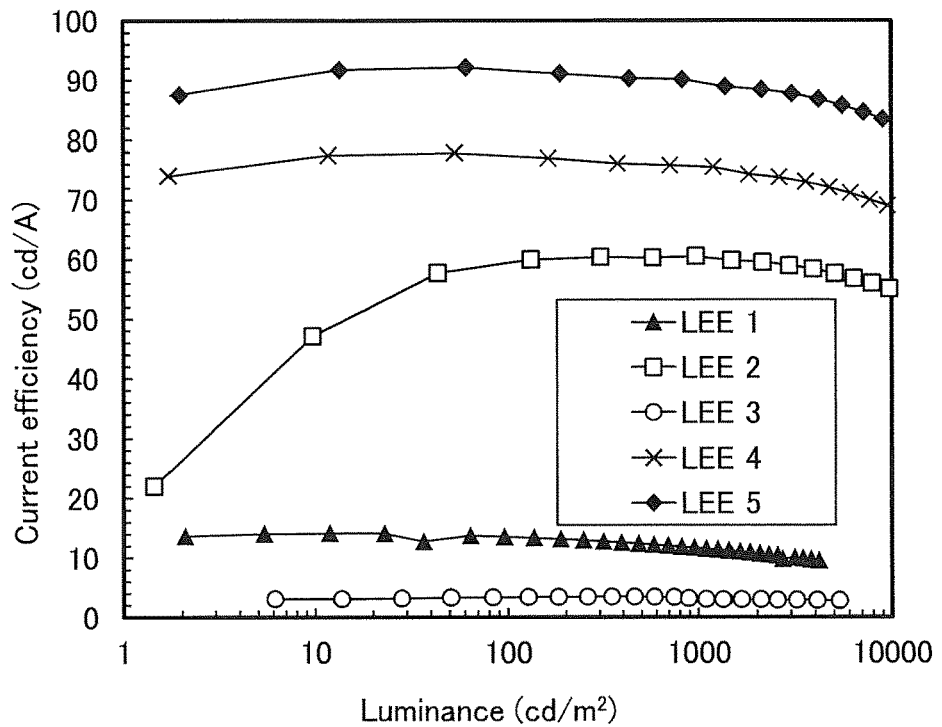
FIG. 7 is a graph showing luminance versus current efficiency characteristics of light-emitting elements 1 to 5 (LEE 1 to LEE 5).
Figure 8:
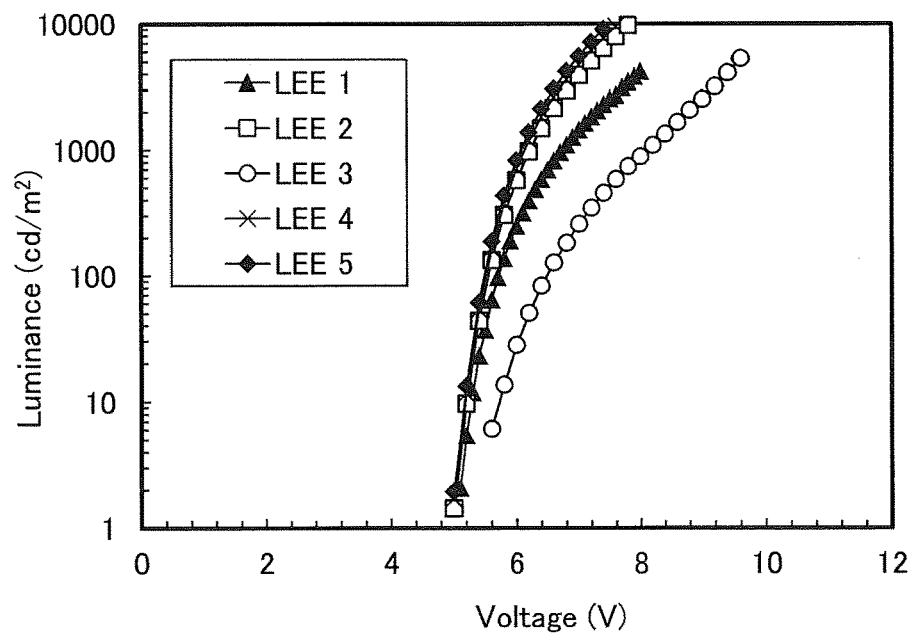
FIG. 8 is a graph showing voltage versus luminance characteristics of light-emitting elements 1 to 5.
Figure 9:
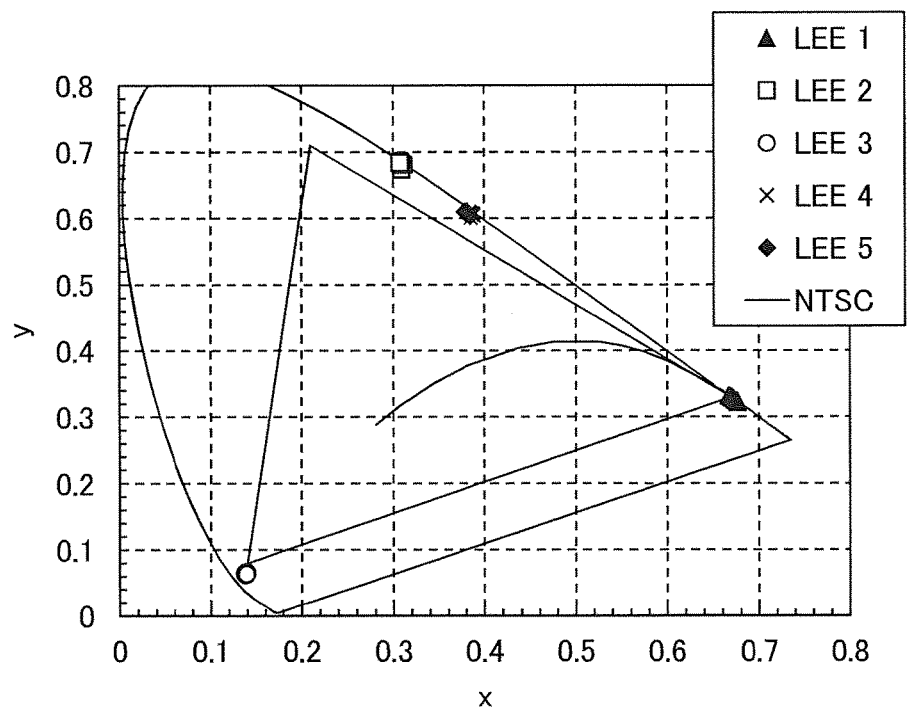
FIG. 9 is a graph showing chromaticity of light-emitting elements 1 to 5.

Operation characteristics of light-emitting elements 1 to 5 were evaluated. The measurement was performed at room temperature (in an atmosphere kept at 25° C.). FIGS. 7 to 9 show the results.

Table 2 shows initial main characteristics of the light-emitting elements 1 to 5 at a luminance of about 1000 cd/m$^2$.

TABLE 2

Initial characteristics of the light-emitting elements (LEE) 1 to 5

| Light-emitting elements | Voltage (V) | Chromaticity (x, y) | Luminance (cd/m$^2$) | Current efficiency (cd/A) |
|---|---|---|---|---|
| LEE 1(R) | 6.7 | (0.67, 0.33) | 950 | 12 |
| LEE 2(G) | 6.2 | (0.31, 0.68) | 980 | 61 |
| LEE 3(B) | 8.2 | (0.14, 0.063) | 1100 | 3.1 |
| LEE 4(Y) | 6.0 | (0.39, 0.61) | 1200 | 76 |
| LEE 5(Y) | 6.0 | (0.38, 0.61) | 830 | 90 |

The above results are summarized as follows. The light-emitting element 1 fabricated in this example can provide red light emission having high color purity close to the red-color chromaticity defined by the national television standards committee (NTSC). The light-emitting Element 2 can provide green light emission having high current efficiency and high color purity close to the green-color chromaticity defined by NTSC. The light-emitting element 3 can provide blue light emission having high color purity close to the blue-color chromaticity defined by NTSC. The light-emitting elements 4 and 5 give yellow emission and have higher current efficiency than the light-emitting elements 1 to 3. Thus, owing to the light-emitting element 4 or 5 with high current efficiency, white light emission obtained by combinations of the red light emission of the light-emitting element 1, the green light emission of the light-emitting element 2, the blue light emission of the light-emitting element 3, and the yellow light-emission of the light-emitting element 4 or 5 can exhibit higher current efficiency than white light emission obtained by combinations of only red light emission, green light emission, and blue light emission.

Figure 10:
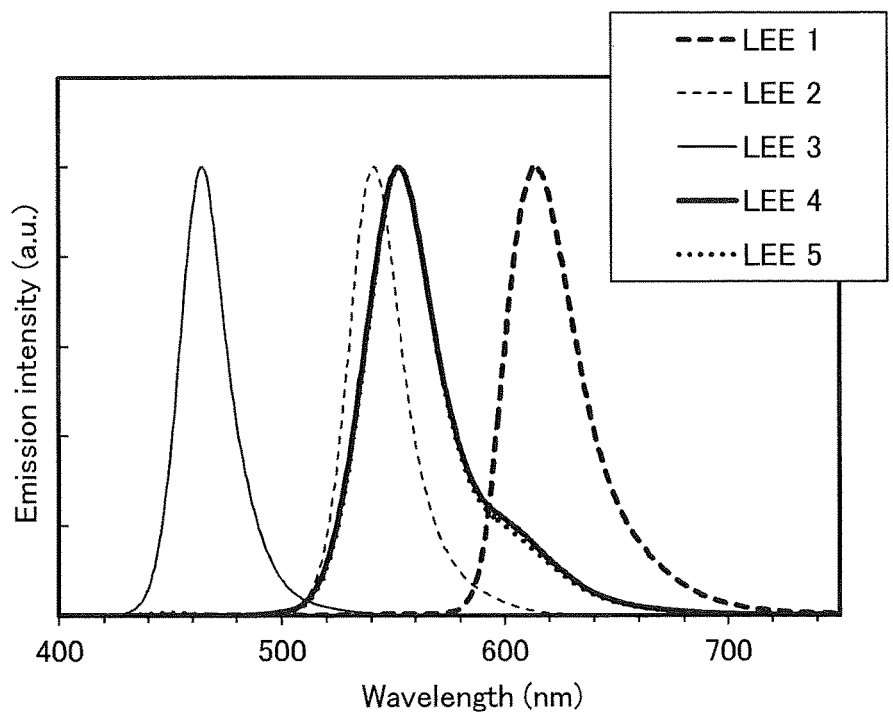
FIG. 10 is a graph showing emission spectra of light-emitting elements 1 to 5.

FIG. 10 shows an emission spectrum when a current at a current density of 2.5 mA/cm$^2$ was supplied to the light-emitting elements 1 to 5. As shown in FIG. 10, the emission spectrum of the light-emitting element 1 which exhibits red light emission has a peak 613 nm, the emission spectrum of the light-emitting element 2 which exhibits green light emission has a peak 541 nm, and the emission spectrum of the light-emitting element 3 which exhibits blue light emission has a peak 464 nm. Each of the light-emitting elements 1 to 3 has a narrow spectrum. The emission spectra of the light-emitting elements 4 and 5 which exhibit yellow light emission have peaks 553 nm and 552 nm, respectively.

Figure 11:
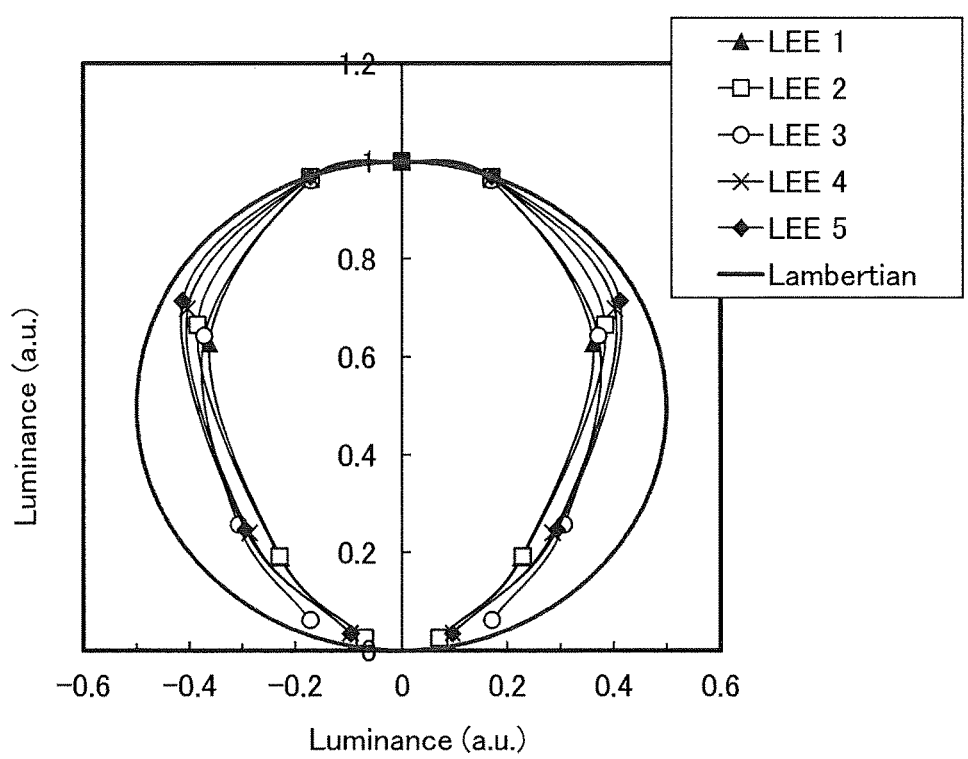
FIG. 11 is a graph showing luminance distribution characteristics of light-emitting elements 1 to 5.

FIG. 11 shows luminance distribution characteristics of the light-emitting elements 1 to 5. As shown in FIG. 11, the light-emitting elements 1 to 5 have substantially the same luminance distribution characteristics. Additionally, the maximum values of the change in chromaticity Δu'v' between the front direction and a direction of 70° from the front direction were as small as 0.044, 0.038, 0.052, 0.059, and 0.067 for the light-emitting elements 1 to 5, respectively. Accordingly, it is found that the combinations of the light-emitting elements 1 to 4, or the combinations of the light-emitting elements 1 to 3 and the light-emitting element 5 can provide white light emission with excellent viewing angle characteristics of luminance and chromaticity.

The light-emitting elements 1 to 4 described in this example were formed over the same substrate. Each of the light-emitting elements 1 to 5 was optically adjusted so that the optical path length from the second electrode 102 to the interface between the first light-emitting layer 106b1 and the second light-emitting layer 106b2 included in the light-emitting layer (B) was less than λ/4. The above result shows that such an element structure enables the formation of a light-emitting element, which is able to emit yellow light at a high luminance and contributes to the reduction of power consumption, over the same substrate together with red-, green-, and blue-emissive light-emitting elements with high color purity based on the NTSC standard.

Power consumption at the time of displaying white on the entire screen fabricated using the light-emitting elements 1 to 4 was 776 mW. The power consumption was calculated in the absence of a circularly polarizing plate under the following conditions: a screen size, 4.3 inches; an aspect ratio, 16:9; an aperture ratio, 35%; effective luminance, 500 cd/m$^2$; and a chromaticity, a D65 white point (x=0.313, y=0.329). Power consumption at the time of displaying white on the entire screen fabricated using the light-emitting elements 1 to 3 was 995 mW under the same conditions. The results show that the display fabricated using the light-emitting elements 1 to 4 has power consumption lower by about 22% than the display fabricated using the light-emitting elements 1 to 3.

Next, power consumption at the time of displaying white on the entire screen fabricated using the light-emitting elements 1 to 3 and the light-emitting element 5 was calculated to be 749 mW. The power consumption was calculated under the following conditions in the absence of a circularly polarizing plate: a screen size, 4.3 inches; an aspect ratio, 16:9; an aperture ratio, 35%; effective luminance, 500 cd/m$^2$; and a chromaticity, a D65 white point (x=0.313, y=0.329). The results show that the display fabricated using the light-emitting elements 1 to 3 and the light-emitting element 5 has power consumption lower by about 25% than the display fabricated using the light-emitting elements 1 to 3. In addition, power consumption at the time of displaying white on the entire screen fabricated using the light-emitting elements 1 to 3 and the light-emitting element 5 having no color filter has power consumption lower than the display fabricated using the light-emitting elements 1 to 4.

This application is based on Japanese Patent Application serial no. 2014-050233 filed with Japan Patent Office on Mar. 13, 2014 and Japanese Patent Application serial no. 2014-050483 filed with Japan Patent Office on Mar. 13, 2014, the entire contents of which are hereby incorporated by reference.

What is claimed is:

1. A light-emitting device comprising:
a first light-emitting element, a second light-emitting element, a third light-emitting element, and a fourth light-emitting element,
wherein:
the first to fourth light-emitting elements each have a reflective electrode and a metal film over the reflective electrode with a white-emissive EL layer interposed therebetween, wherein the metal film is thin enough to have a light-transmitting property; and
the first to fourth light-emitting elements are optically optimized independently so that the first to fourth light-emitting elements selectively emit red light, green light, blue light, and yellow light, respectively.

2. The light-emitting device according to claim 1, wherein the white-emissive EL layer is shared by the first to fourth light-emitting elements.

3. The light-emitting device according to claim 1, wherein the white-emissive EL layer extends between the first to fourth light-emitting elements.

4. The light-emitting device according to claim 1, wherein the metal film is shared by the first to fourth light-emitting elements.

5. The light-emitting device according to claim 1, wherein the metal film extends between the first to fourth light-emitting elements.

6. The light-emitting device according to claim 1, further comprising:
a red color filter, a green color filter, and a blue color filter over the first to third light-emitting elements, respectively.

7. The light-emitting device according to claim 6, wherein the fourth light-emitting element is configured so that light emitted therefrom is extracted outside of the light-emitting device without a color filter.

8. The light-emitting device according to claim 1, further comprising:
a red color filter, a green color filter, a blue color filter, and a yellow color filter over the first to fourth light-emitting elements, respectively.

9. The light-emitting device according to claim 1, wherein an edge portion of the white-emissive EL layer is entirely covered by the metal film.

10. A lighting device comprising the light-emitting device according to claim 1.

11. The light-emitting device according to claim 1, wherein thicknesses of the reflective electrodes are different between the first to fourth light-emitting elements.

12. A light-emitting device comprising:
a first light-emitting element, a second light-emitting element, a third light-emitting element, and a fourth light-emitting element,
wherein:
the first to fourth light-emitting elements each have a reflective electrode and a metal film over the reflective electrode with a white-emissive EL layer interposed therebetween, wherein the metal film is thin enough to have a light-transmitting property;
the white-emissive EL layer and the metal film are shared by the first to fourth light-emitting elements;
the white-emissive EL layer has the same structure between the first to fourth light-emitting elements other than layers in direct contact with the respective reflective electrodes;

the reflective electrodes each comprise a reflective conductive film and a transparent conductive film over the reflective conductive film; and thicknesses of the reflective conductive films are different between the first to fourth light-emitting elements so that the first to fourth light-emitting elements selectively emit red light, green light, blue light, and yellow light, respectively.

13. The light-emitting device according to claim 12, wherein the white-emissive EL layer extends between the first to fourth light-emitting elements.

14. The light-emitting device according to claim 12, wherein the metal film extends between the first to fourth light-emitting elements.

15. The light-emitting device according to claim 12, further comprising:

a red color filter, a green color filter, and a blue color filter over the first to third light-emitting elements, respectively.

16. The light-emitting device according to claim 15, wherein the fourth light-emitting element is configured so that light emitted therefrom is extracted outside of the light-emitting device without a color filter.

17. The light-emitting device according to claim 12, further comprising:

a red color filter, a green color filter, a blue color filter, and a yellow color filter over the first to fourth light-emitting elements, respectively.

18. The light-emitting device according to claim 12, wherein an edge portion of the white-emissive EL layer is entirely covered by the metal film.

19. The light-emitting device according to claim 12, wherein thicknesses of the layers are different between the first to fourth light-emitting elements.

20. A lighting device comprising the light-emitting device according to claim 12.

* * * * *